(12) United States Patent  
Narasimhan et al.

(10) Patent No.: US 11,569,102 B2  
(45) Date of Patent: Jan. 31, 2023

(54) OXIDATION INHIBITING GAS IN A MANUFACTURING SYSTEM

(71) Applicant: Applied Materials, Inc., Santa Clara, CA (US)

(72) Inventors: Murali Narasimhan, San Jose, CA (US); Patrick Pannese, San Jose, CA (US); Kunal Jain, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 407 days.

(21) Appl. No.: 16/791,275

(22) Filed: Feb. 14, 2020

(65) Prior Publication Data

US 2021/0257233 A1    Aug. 19, 2021

(51) Int. Cl.
*H01L 21/67* (2006.01)
*G05D 11/10* (2006.01)

(52) U.S. Cl.
CPC ........ *H01L 21/67196* (2013.01); *G05D 11/10* (2013.01); *H01L 21/67248* (2013.01)

(58) Field of Classification Search
CPC ......... H01L 21/67196; H01L 21/67248; H01L 21/67201; H01L 21/67253; H01L 21/6719; G05D 11/10
USPC ........................................................ 118/708
See application file for complete search history.

(56) References Cited

U.S. PATENT DOCUMENTS

| | | | |
|---|---|---|---|
| 5,364,219 A | 11/1994 | Takahashi et al. | |
| 5,664,925 A | 9/1997 | Muka et al. | |
| 5,988,233 A | 11/1999 | Fosnight et al. | |
| 5,997,235 A | 12/1999 | Hofmeister | |
| 6,199,604 B1 | 3/2001 | Miyajima | |
| 6,302,927 B1 | 10/2001 | Tanigawa | |
| 6,368,411 B2 | 4/2002 | Roberson, Jr. et al. | |

(Continued)

FOREIGN PATENT DOCUMENTS

| JP | 200334899 A | 11/2003 |
|---|---|---|
| JP | 2008091920 A | 4/2008 |

(Continued)

OTHER PUBLICATIONS

International Search Report and Written Opinion of International Application No. PCT/US2021/017503, dated Jul. 30, 2021.

(Continued)

*Primary Examiner* — Vu A Vu

(74) *Attorney, Agent, or Firm* — Lowenstein Sandler LLP

(57) ABSTRACT

A method includes flowing gas comprising an oxidation inhibiting gas into a chamber of a semiconductor processing system. The chamber includes one or more of a factory interface of the semiconductor processing system or an adjacent chamber that is mounted to the factory interface. The method further includes receiving, via one or more sensors coupled to the chamber, sensor data indicating at least one of a current oxygen level within the chamber or a current moisture level within the chamber. The method further includes determining, based on the sensor data, whether to perform an adjustment of a current amount of the oxidation inhibiting gas entering into the chamber. The method further includes, responsive to determining to perform the adjustment, causing the adjustment of the current amount of the oxidation inhibiting gas entering into the chamber.

19 Claims, 9 Drawing Sheets

(56) References Cited

U.S. PATENT DOCUMENTS

| | | |
|---|---|---|
| 6,430,802 B1 | 8/2002 | Miyajima |
| 6,641,349 B1 | 11/2003 | Miyajima et al. |
| 6,899,145 B2 | 5/2005 | Aggarwal |
| 7,077,173 B2 | 7/2006 | Tokunaga |
| 7,169,280 B2 * | 1/2007 | Klocke ............... C25D 13/12 |
| | | 204/626 |
| 7,360,981 B2 | 4/2008 | Weaver |
| 2002/0013063 A1 | 1/2002 | Kojima et al. |
| 2002/0197145 A1 | 12/2002 | Yamamoto et al. |
| 2003/0021657 A1 | 1/2003 | Yamagishi |
| 2003/0031537 A1 | 2/2003 | Tokunaga |
| 2003/0077150 A1 | 4/2003 | Matsuda et al. |
| 2005/0077204 A1 | 4/2005 | Sumi et al. |
| 2005/0105997 A1 | 5/2005 | Englhardt et al. |
| 2005/0111935 A1 | 5/2005 | Kim et al. |
| 2005/0169730 A1 | 8/2005 | Aggarwal et al. |
| 2006/0061979 A1 | 3/2006 | Elliott et al. |
| 2006/0065571 A1 | 3/2006 | Hsiao et al. |
| 2007/0057322 A1 | 3/2007 | Elliott et al. |
| 2007/0059145 A1 | 3/2007 | Rice et al. |
| 2007/0140822 A1 | 6/2007 | Elliott et al. |
| 2007/0141280 A1 | 6/2007 | Rice |
| 2007/0158183 A1 | 7/2007 | Shah et al. |
| 2009/0110518 A1 | 4/2009 | Rice et al. |
| 2015/0016941 A1 | 1/2015 | Rice et al. |
| 2018/0138068 A1 | 5/2018 | Rice et al. |
| 2018/0358239 A1 | 12/2018 | Senn et al. |
| 2018/0374733 A1 * | 12/2018 | Pannese ............ H01L 21/67775 |

FOREIGN PATENT DOCUMENTS

| | | |
|---|---|---|
| KR | 20200037695 A | 5/2002 |
| KR | 20050016904 A | 2/2005 |

OTHER PUBLICATIONS

International Preliminary Report on Patentability on application No. PCT/US2008/081015, dated Dec. 16, 2008.

* cited by examiner

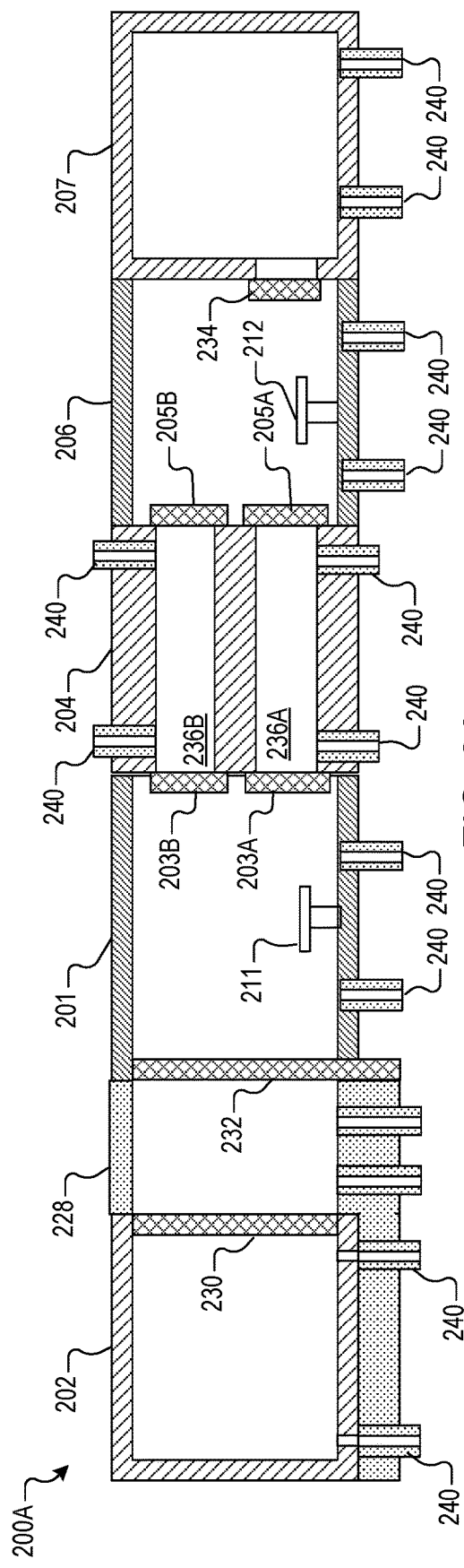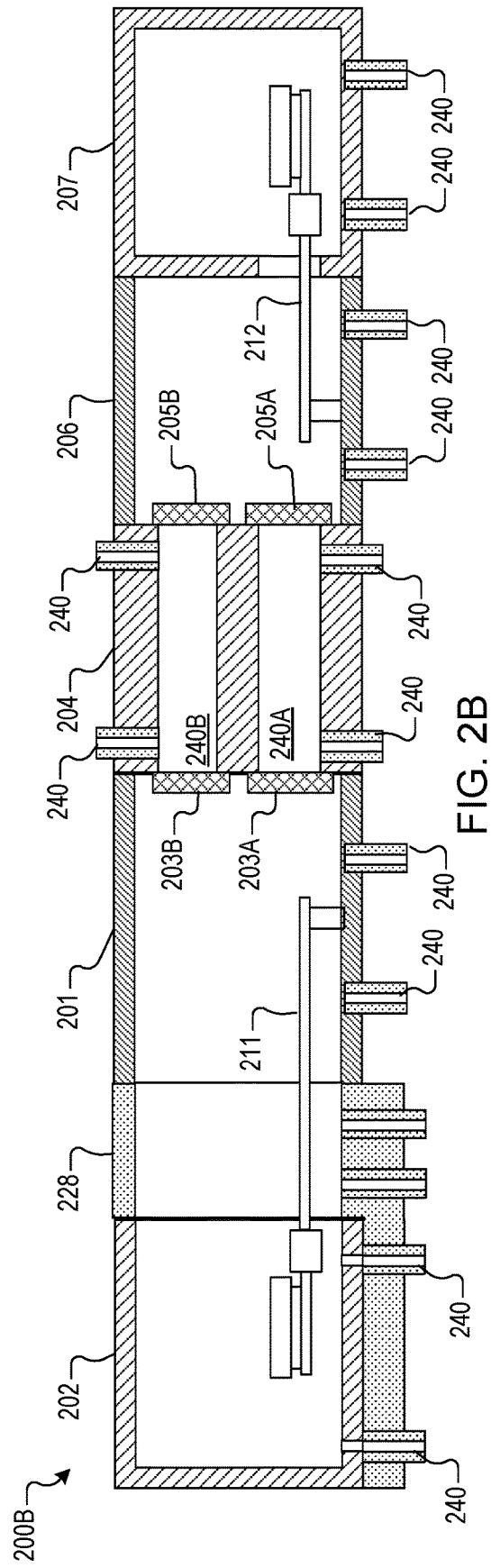

OXIDATION INHIBITING GAS IN A MANUFACTURING SYSTEM

TECHNICAL FIELD

Embodiments of the present disclosure relate to manufacturing systems, such as wafer processing systems, and in particular to oxidation inhibiting gas in a manufacturing system.

BACKGROUND

In semiconductor processing and other electronics processing, objects, such as wafers, are often transported between portions of the system. The different portions of the system include storage areas, transfer areas, processing areas, and so forth.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an aspect of the disclosure, a method includes flowing gas comprising an oxidation inhibiting gas into a chamber of a semiconductor processing system. The chamber includes one or more of a factory interface of the semiconductor processing system or an adjacent chamber that is mounted to the factory interface. The method further includes receiving, via one or more sensors coupled to the chamber, sensor data indicating at least one of a current oxygen level within the chamber or a current moisture level within the chamber. The method further includes determining, based on the sensor data, whether to perform an adjustment of a current amount of the oxidation inhibiting gas entering into the chamber. The method further includes, responsive to determining to perform the adjustment, causing the adjustment of the current amount of the oxidation inhibiting gas entering into the chamber.

In another aspect of the disclosure, a non-transitory machine-readable storage medium storing instructions which, when executed, cause a processing device to perform operations including flowing gas comprising an oxidation inhibiting gas into a chamber of a semiconductor processing system. The chamber includes one or more of a factory interface of the semiconductor processing system or an adjacent chamber that is mounted to the factory interface. The operations further include receiving, via one or more sensors coupled to the chamber, sensor data indicating at least one of a current oxygen level within the chamber or a current moisture level within the chamber. The operations further include determining, based on the sensor data, whether to perform an adjustment of a current amount of the oxidation inhibiting gas entering into the chamber. The operations further include, responsive to determining to perform the adjustment, causing the adjustment of the current amount of the oxidation inhibiting gas entering into the chamber.

In another aspect of the disclosure, a semiconductor processing system includes a chamber including an oxidation inhibiting gas inlet configured to receive an oxidation inhibiting gas into the chamber. The chamber includes one or more of a factory interface or an adjacent chamber that is mounted to the factory interface. The semiconductor processing system further includes one or more sensors coupled to the chamber. The one or more sensors are configured to provide sensor data indicating at least one of a current oxygen level within the chamber or a current moisture level within the chamber. The semiconductor processing system further includes a processing device to cause, based on the sensor data, an adjustment of a current amount of the oxidation inhibiting gas entering into the chamber.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 2A illustrates a cross-sectional view of a processing system, according to certain embodiments.

FIG. 2B illustrates a cross-sectional view of a processing system, according to certain embodiments.

DETAILED DESCRIPTION OF EMBODIMENTS

Figure 1:
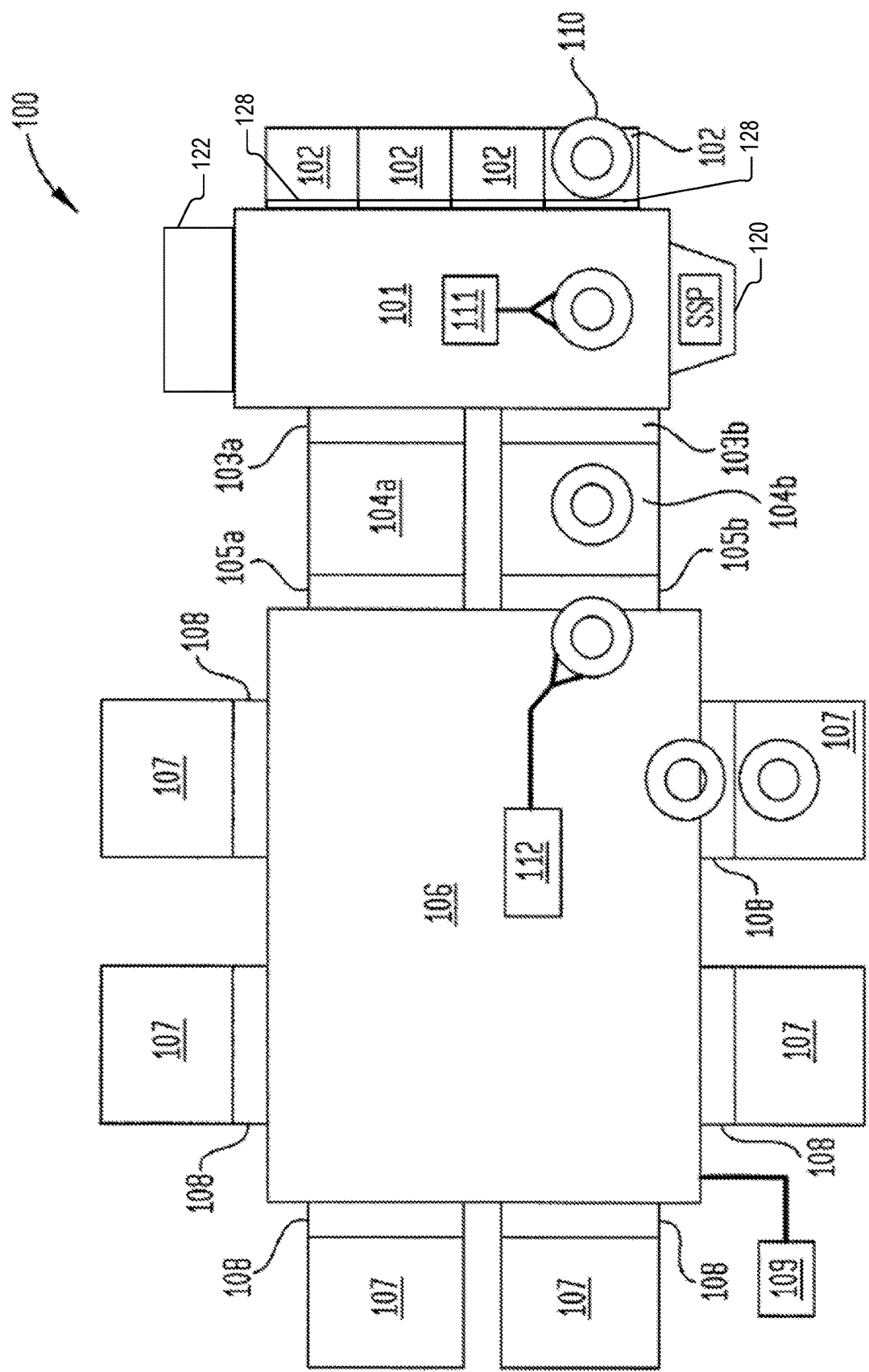
FIG. 1 illustrates a processing system, according to certain embodiments.

Embodiments described herein are related to oxidation inhibiting gas in a manufacturing system. In a manufacturing system, such as a semiconductor manufacturing system, objects (e.g., wafers) are transported between different portions of the manufacturing system. The portions of the manufacturing system include one or more of a factory interface, enclosure system (e.g., substrate enclosure system, front opening unified pod (FOUP)), loadlock system, load port, storage area, cooling station, transfer chamber, processing chambers, metrology station, or the like. Oxygen and moisture enter the portions of the manufacturing system (e.g., via opening and closing of the portions of the manufacturing system, via leakage, via being open to the atmosphere, etc.).

Some objects are sensitive to oxidation. For example metal films, processed objects, and heated objects are prone to oxidation in the presence of oxygen and/or moisture. Oxidation affects performance of objects. In conventional systems, objects that spend more time in a storage area (e.g., FOUP, storage area, etc.) have more oxidation than objects that spend less time in a storage area. For example, in conventional systems, the last wafers transferred from a FOUP (e.g., having spent more time in the FOUP than other wafers) and/or the first wafers transferred to a FOUP after processing (e.g., to spend more time in the FOUP after processing than other wafers) have more oxidation than other wafers, which results in variations in performance of wafers. Variations in performance of wafers causes instances of the same type of product to have different lifespans, different failures, or the like. In conventional systems, to reduce oxidation, objects that have an elevated temperature (e.g., after being processed) are allowed to cool down (e.g., by placing the object in a cooling station, by waiting to transfer the object out of the processing chamber and/or transfer chamber), which increases the time to produce objects and decreases throughput.

The devices, systems, and methods disclosed herein provide oxidation inhibiting gas in a manufacturing system. In some embodiments, the oxidation inhibiting gas is hydrogen and/or ammonia. The oxidation inhibiting gas is provided into a chamber of the manufacturing system. The chamber includes one or more of a factory interface of the manufacturing system or an adjacent chamber (e.g., FOUP, loadlock system, storage area, cooling station, metrology station, etc.) that is mounted to the factory interface. In some embodiments, the gas flowing into the chamber is up to 5% oxidation inhibiting gas (e.g., hydrogen, ammonia). In some embodiments, the gas flowing into the chamber also includes an inert gas, such as one or more of nitrogen, argon, neon, helium, krypton, or xenon. In one example, the gas flowing into the chamber includes up to 5% oxidation inhibiting gas and the remaining balance of the gas flowing into the chamber is an inert gas (e.g., 96% nitrogen and 4% hydrogen).

Providing oxidation inhibiting gas into the manufacturing system reduces oxidation of objects within the manufacturing system. For example, combining up to 5% hydrogen with inert gas (e.g., nitrogen) produces a forming gas that reduces oxidation of object. In some embodiments, hydrogen getters oxygen by reacting with the oxygen to form molecules of water that are removed from the chamber.

A processing device causes the flowing of gas into the chamber and the processing device receives, via one or more sensors, sensor data. In some embodiments, the sensor data is indicative of one or more of current oxygen level or current moisture level within the chamber. The current oxygen level and/or current moisture level in a chamber vary responsive to opening and closing of chambers, leakage through the chamber, and so forth. The processing device determines, based on the sensor data, whether to perform an adjustment of a current amount of the oxidation inhibiting gas entering into the chamber and, responsive to determining to perform the adjustment, causes the adjustment. In some embodiments, the processing device adjusts the current amount of the oxidation inhibiting gas entering into the chamber independent of the amount of inert gas entering the chamber (e.g., increase flow rate of hydrogen into the chamber independent of the flow rate of inert gas, adjust gas flowing into the chamber from 4% hydrogen and 96% inert gas to 4.5% hydrogen and 95.5% inert gas, etc.). In some embodiments, the processing device adjusts the current amount of oxidation inhibiting gas entering into the chamber and the current amount of inert gas entering into the chamber at the same rate (e.g., the gas flowing into the chamber includes set percentages of hydrogen and inert gas and the overall gas flowing into the chamber is increased and decreased). In some embodiments, responsive to current oxygen level and/or current moisture level being below a threshold amount, the processing device decreases the amount of oxidation inhibiting gas entering the chamber. In some embodiments, responsive to current oxygen level and/or current moisture level being above a threshold amount, the processing device increases the amount of oxidation inhibiting gas entering the chamber. In some embodiments, the processing device causes adjustment of a current amount of oxidation inhibiting gas entering into the chamber for reasons other than current oxygen and/or moisture levels, such as determining a chamber has opened or closed, receiving sensor data indicating a temperature (e.g., of a wafer, inside the chamber, etc.), determining wafer transportation activity, etc. In some embodiments, the processing device causes adjustment of current amount of gas entering multiple chambers of the manufacturing system (e.g., at the same rate, at different rates). In some embodiments, at least a portion of the gas flowing into the chamber is recirculated in the chamber and adjustment of the current amount of oxidation inhibiting gas entering the chamber includes inputting non-recirculated oxidation inhibiting gas into the chamber (e.g., and exhausting a portion of the gas within the chamber).

The devices, systems, and methods disclosed herein have advantages over conventional solutions. The advantages include reducing oxidation of objects in chambers compared to conventional systems. The advantages further include less performance differences (e.g., due to less oxidation) between objects that spend different amounts of time in storage areas than in conventional systems. The advantages further include transferring objects into the factory interface and/or adjacent chambers at higher temperatures than conventional systems, decreasing time to produce objects and increasing throughput.

FIG. 1 illustrates a processing system 100 (e.g., a wafer processing system, manufacturing system), according to certain embodiments. The processing system 100 includes a factory interface 101 (e.g., equipment front end module (EFEM)). The processing system 100 further includes additional chambers (e.g., adjacent chambers) that are coupled (e.g., mounted, attached, physically coupled, or the like) to the factory interface 101. In some embodiments, the chambers of the processing system 100 include the factory interface 101 and one or more of enclosure systems 102 (e.g., substrate enclosure systems, FOUPs), load ports 128, loadlock systems 104 (e.g., degassing chambers, loadlock chambers), storage area 120 (e.g., side storage pod (SSP) or substrate support pedestal (SSP)), cooling station 122 (e.g., used to cool content 110, such as substrates that have been processed in one or more processing chambers 107), metrology station 124 (e.g., used to perform measurements of content 110, such as substrates that have been processed in one or more processing chambers 107), or the like coupled to the factory interface 101. In some embodiments, the processing system 100 includes multiple load ports 128 to which enclosure systems 102 are removably coupled for transferring wafers and/or other substrates into and out of the processing system 100. For example, an enclosure system 102A is docked to the load port 128, undocked from the load port 128, and then an enclosure system 102B is docked to the load port 128. The enclosure system 102 is for transferring content 110 (e.g., process kit rings, wafers, substrates, objects, carriers, etc.) into and out of the processing system 100.

In some embodiments, a load port 128 includes a front interface that forms a vertical opening and the load port 128 has a horizontal surface. An enclosure system 102 has a front interface that forms a vertical opening. The front interface of the enclosure system 102 is sized to interface with (e.g., seal to) the front interface of the load port 128 (e.g., the vertical opening of the enclosure system 102 is approximately the same size as the vertical opening of the load port 128). The enclosure system 102 is placed on the horizontal surface of the load port 128 and the vertical opening of the enclosure system 102 aligns with the vertical opening of the load port 128. The front interface of the enclosure system 102 interconnects with (e.g., clamps to, is secured to, is sealed to) the front interface of the load port 128. A bottom plate (e.g., base plate) of the enclosure system 102 has features (e.g., load features, such as recesses or receptacles, that engage with load port kinematic pin features, a load port datum pin clearance, and/or a FOUP docking tray latch clamping feature) that engage with the horizontal surface of the load port 128.

The enclosure system 102 includes one or more items of content 110 (e.g., one or more of a process kit ring, an empty process kit ring carrier, a process kit ring disposed on a process kit ring carrier, a placement validation wafer, a wafer, a substrate, etc.). The enclosure system 102 is coupled to the factory interface 101 (e.g., via load port 128) to enable automated transfer of wafer into the processing system 100 for processing of the wafer.

In some embodiments, processing system 100 includes first vacuum ports 103a, 103b coupling the factory interface 101 to respective loadlock systems 104a, 104b (e.g., degassing chambers). Second vacuum ports 105a, 105b are coupled to respective loadlock systems 104a, 104b (e.g., degassing chambers) and disposed between the loadlock systems 104a, 104b and a transfer chamber 106 to facilitate transfer of wafers and content 110 (e.g., wafers) into the transfer chamber 106. In some embodiments, a processing system 100 includes and/or uses one or more loadlock systems 104 and a corresponding number of vacuum ports 103, 105 (e.g., a processing system 100 includes a single loadlock system 104, a single first vacuum port 103, and a single second vacuum port 105). The transfer chamber 106 includes processing chambers 107 (e.g., four processing chambers 107, six processing chambers 107, etc.) disposed therearound and coupled thereto. The processing chambers 107 are coupled to the transfer chamber 106 through respective ports 108, such as slit valves or the like. In some embodiments, the factory interface 101 is at a higher pressure (e.g., substantially equal to or greater than atmospheric pressure) and the transfer chamber 106 is at a lower pressure (e.g., vacuum or atmosphere). In some embodiments, the factory interface 101 is at a first pressure (e.g., substantially equal to or greater than atmospheric pressure) and the transfer chamber 106 is at a second pressure (e.g., vacuum or atmosphere). In some embodiments, the factory interface 101 (e.g., atmospheric factory interface) is at a first pressure that is substantially equal to or greater than atmospheric pressure and the transfer chamber 106 (e.g., atmospheric transfer chamber) is at a second pressure that is substantially equal to or greater than atmospheric pressure (e.g., substantially equal to the first pressure, less than the first pressure, greater than the first pressure).

In some embodiments, the processing system 100 is an atmospheric platform (e.g., an atmospheric system, one or more portions of the processing system 100 are at or above atmospheric pressure). In some embodiments, the environment within an atmospheric platform (e.g., atmospheric system) is inert or a forming gas to maintain wafer environment throughout process flow.

Each loadlock system 104 has a first door (e.g., first vacuum port 103) to seal the loadlock system 104 from the factory interface 101 and a second door (e.g., second vacuum port 105) to seal the loadlock system 104 from the transfer chamber 106. Content is transferred from the factory interface 101 into a loadlock system 104 while the first door is open and the second door is closed, the first door closes, the pressure in the loadlock system 104 reduces to match the transfer chamber 106, the second door opens, and the content is transferred out of the loadlock system 104. In some embodiments, a local center finding (LCF) device and/or other aligner device is used to align the content in the transfer chamber 106 (e.g., before entering a processing chamber 107, after leaving the processing chamber 107, before entering the loadlock system 104, after leaving the loadlock system 104, etc.). In some embodiments, an LCF device and/or an aligner device is disposed in the transfer chamber 106. In some embodiments, an LCF device and/or an aligner device is disposed in the factory interface 101. In some embodiments, an LCF device and/or an aligner device is disposed in the factory interface 101 and a LCF device and/or aligner device is disposed in the transfer chamber 106.

In some embodiments, the processing chambers 107 include one or more of etch chambers, deposition chambers (including atomic layer deposition, chemical vapor deposition, physical vapor deposition, or plasma enhanced versions thereof), anneal chambers, or the like.

Factory interface 101 includes a factory interface robot 111. In some embodiments, factory interface robot 111 includes a robot arm, and is or includes a selective compliance assembly robot arm (SCARA) robot, such as a 2 link SCARA robot, a 3 link SCARA robot, a 4 link SCARA robot, and so on. The factory interface robot 111 includes an end effector on an end of the robot arm. In some embodiments, the end effector is configured to pick up and handle specific objects, such as wafers. In some embodiments, the end effector is configured to handle objects such as a calibration substrate and process kit rings (edge rings). In some embodiments, the end effector is configured to scan objects (e.g., autoteach pin, calibration pin, etc.). The robot arm has one or more links or members (e.g., wrist member, upper arm member, forearm member, etc.) that are configured to be moved to move the end effector in different orientations to different locations.

The factory interface robot 111 is configured to transfer content 110 between enclosure systems 102 (e.g., FOUPs), factory interface 101, storage area 120, cooling station 122, and loadlock system 104a, 104b.

Transfer chamber 106 includes a transfer chamber robot 112. Transfer chamber robot 112 includes a robot arm with an end effector at an end of the robot arm. The end effector is configured to handle particular objects, such as wafers. In some embodiments, the transfer chamber robot 112 is a SCARA robot, but has fewer links and/or fewer degrees of freedom than the factory interface robot 111 in some embodiments.

A controller 109 controls various aspects of the processing system 100. In some embodiments, the controller 109 is and/or includes a computing device such as a personal computer, a server computer, a programmable logic controller (PLC), a microcontroller, and so on. In some embodiments, the controller 109 includes one or more processing devices, which are general-purpose processing devices such as a microprocessor, central processing unit, or the like. In some embodiments, the processing device is a complex instruction set computing (CISC) microprocessor, reduced instruction set computing (RISC) microprocessor, very long instruction word (VLIW) microprocessor, or a processor implementing other instruction sets or processors implementing a combination of instruction sets. In some embodiments, the processing device is one or more special-purpose processing devices such as an application specific integrated circuit (ASIC), a field programmable gate array (FPGA), a digital signal processor (DSP), network processor, or the like. In some embodiments, the controller 109 includes a data storage device (e.g., one or more disk drives and/or solid state drives), a main memory, a static memory, a network interface, and/or other components. In some embodiments, the controller 109 executes instructions to perform any one or more of the methods or processes described herein. In some embodiments, the instructions are stored on a computer readable storage medium, which includes the main memory, static memory, secondary storage and/or processing device (during execution of the instructions). The controller 109 receives signals from and send controls to factory interface robot 111 and wafer transfer chamber robot 112 in embodiments. In some embodiments, the controller 109 causes flowing of gas including an oxidation inhibiting gas into one or more portions of the processing system 100, receives sensor data (e.g., indicative of a current oxygen and/or moisture levels, indicative of opening or closing a chamber, etc.), and cause adjustment of the current amount of oxidation inhibiting gas entering into a portion of the processing system 100 based on the sensor data.

FIG. 1 schematically illustrates transfer of content 110 (e.g., a wafer) into a processing chamber 107. According to one aspect of the disclosure, content 110 is removed from an enclosure system 102 via factory interface robot 111 located in the factory interface 101. The factory interface robot 111 transfers the content 110 through one of the first vacuum ports 103*a*, 103*b* and into a respective loadlock system 104*a*, 104*b*. A transfer chamber robot 112 located in the transfer chamber 106 removes the content 110 from one of the loadlock systems 104*a*, 104*b* through a second vacuum port 105*a* or 105*b*. The transfer chamber robot 112 moves the content 110 into the transfer chamber 106, where the content 110 is transferred to a processing chamber 107 though a respective port 108. In some embodiments, transfer of the content 110 includes transfer of an object (e.g., wafer, process kit ring, etc.) disposed on a process kit ring carrier, transfer of an empty process kit ring carrier, transfer of a placement validation wafer, etc.

FIG. 1 illustrates one example of transfer of content 110. In some embodiments, other examples of transfer of content 110 are employed. For example, in some embodiments, the enclosure system 102 is coupled to the transfer chamber 106 (e.g., via a load port in the transfer chamber 106). From the transfer chamber 106, the content 110 is loaded into a processing chamber 107 by the transfer chamber robot 112. Additionally, in some embodiments, content 110 is loaded in a storage area 120. In some embodiments, two or more storage areas 120 (SSPs) are positioned in communication with the factory interface 101 (e.g., a first SSP opposite a second SSP). In some embodiments, processed content 110 (e.g., a processed wafer, a used process kit ring) is removed from the processing system 100 in reverse of any manner described herein. When utilizing multiple enclosure systems 102 or a combination of enclosure system 102 and storage area 120, in some embodiments, one storage area 120 or enclosure system 102A is used for unprocessed content 110 (e.g., wafers to be processed, new process kit rings), while another storage area 120 or enclosure system 102B is used for receiving processed content 110 (e.g., wafers that have been processed, used process kit rings).

FIG. 2A illustrates a cross-sectional view of a processing system 200A (e.g., processing system 100 of FIG. 1), according to certain embodiments. FIG. 2B illustrates a cross-sectional view of a processing system 200B (e.g., processing system 100 of FIG. 1), according to certain embodiments. In some embodiments, processing systems 200A and 200B are the same processing system 200.

The processing system 200 includes a factory interface 201 (e.g., factory interface 101 of FIG. 1). The processing system 200 includes chambers that are coupled to the factory interface 201. For example, the factory interface 201 is coupled to one or more of enclosure system 202 (e.g., substrate enclosure system, enclosure system 102 of FIG. 1), load port 228 (e.g., load port 128 of FIG. 1), loadlock system 204 (e.g., loadlock system 104*a* and/or 104*b* of FIG. 1), a transfer chamber 206 (e.g., transfer chamber 106 of FIG. 1), and/or processing chamber 107 (e.g., processing chamber 107 of FIG. 1). The factory interface 201 includes a robot arm 211 (e.g., factory interface robot 111 of FIG. 1) and transfer chamber 206 includes a robot arm 212 (e.g., transfer chamber robot 112 of FIG. 1). One or more portions of processing system 200 is placed in an open position or a closed position (e.g., sealed position). Gas flow is provided into and/or out of one or more portions of the processing system 200 (e.g., responsive to being in an open position, responsive to being in a closed position, responsive to transitioning between open and closed positions, based on sensor data, and/or via ports 240).

Enclosure system 202 is in a closed position responsive to a door 230 being coupled (e.g., sealed) to the enclosure system 202.

Load port 228 is configured to be placed in a closed position. For example, a door carrier 232 is in a coupled (e.g., sealed) to a first portion of the load port 228 and the enclosure system 202 and/or door 230 is coupled (e.g., sealed) to a second portion of the load port 228. In some embodiments, the door carrier 232 is configured to place the door 230 in a closed position and in an open position (e.g., the door carrier 232 is configured to remove the door 230 from the enclosure system 202 and to secure the door 230 to the enclosure system 202).

Loadlock system 204 is in a closed position responsive to doors 203 and 205 being sealed to the loadlock system 204. In some embodiments, the loadlock system 204 has multiple loadlock chambers 236 and each loadlock chamber 236 has corresponding doors 203, 205.

The processing chamber 207 is in a closed position responsive to door 234 being coupled (e.g., sealed) to the processing chamber 207.

The factory interface 201 is in a closed position responsive to the door carrier 232 (or door 230) and the doors 203 being in closed positions. The transfer chamber 206 is in a closed position responsive to the doors 205 and the door 234 being in closed positions.

Responsive to door carrier 232 and/or door 230 being in an open position (e.g., see FIG. 2B), robot arm 211 transports content (e.g., a wafer) from the enclosure system 202 to a different portion of the processing system 200 (e.g., to factory interface 201, to loadlock system 204, to a storage area, cooling station, metrology station, etc.). Responsive to door 234 being in an open position (e.g., see FIG. 2B), robot arm 212 transports content (e.g., wafer) from the processing chamber 207 to another portion of the processing system 200 (e.g., to transfer chamber 206, to loadlock system 204, etc.).

One or more portions of the processing system 200 include one or more corresponding ports 240 (e.g., inlet, outlet, etc.). One or more flow devices (e.g., recirculation pump, exhaust pump, insertion pump, valve, etc.) are coupled to the ports 240.

In some embodiments, a processing device (e.g., controller 109 of FIG. 1) causes gas flow (e.g., supplying non-recirculated gas, supplying recirculated gas, exhausting gas, etc.) through the ports 240. The processing device receives sensor data (e.g., oxygen sensor, moisture sensor, door actuation sensor, temperature sensor, etc.) and causes gas flow through one or more ports 240 based on the sensor data. The processing device causes adjustment of the current amount of oxidation inhibiting gas and/or inert gas entering into a portion of the processing system 200. In some embodiments, the processing device causes the current amount of oxidation inhibiting gas and the current amount of inert gas to be adjusted independent of each other or at the same rate. In some embodiments, oxidation inhibiting gas is input to a portion of the processing system 200 via a first port 240A and inert gas is input to the portion of the processing system 200 via a second port 240B. In some embodiments, oxidation inhibiting gas and inert gas are provided through the same port 240 (e.g., a mixture of oxidation inhibiting gas and inert gas is provided through the same port 240).

FIGS. 3A-D illustrate cross-sectional views of chambers 302A-D of processing systems 300 (e.g., processing system 100 of FIG. 1, processing systems 200A-B of FIGS. 2A-B), according to certain embodiments. In some embodiments, a chamber 302 is one or more of an enclosure system (e.g., FOUP, enclosure system 102 of FIG. 1, enclosure system 202 of FIGS. 2A-B, or the like), a load port (e.g., load port 128 of FIG. 1, load port 228 of FIGS. 2A-B), a factory interface (e.g., factory interface 101 of FIG. 1, factory interface 201 of FIGS. 2A-B), a load lock system (e.g., load lock system 104 of FIG. 1, load lock system 204 of FIGS. 2A-B), a storage area (e.g., an SSP, storage area 120 of FIG. 1), a cooling station (e.g., cooling station 122 of FIG. 1), metrology station (e.g., metrology station 124 of FIG. 1), or the like. In some embodiments, chamber 302 is a processing chamber, transfer chamber, or other chamber of a processing system 300 (e.g., semiconductor processing system).

The chamber 302 includes sidewalls 304 (e.g., top, bottom, rear, front, first side, second side, etc. sidewalls) and one or more doors 306. The sidewalls 304 and one or more doors 306 enclose an interior volume 308. The chamber 302 includes one or more ports 310 (e.g., inlet, outlet, or the like) from the interior volume 308, through one or more sidewalls 304, and to exterior of the chamber 302. In some embodiments, the chamber 302 includes one or more valves (e.g., backflow prevention valve, throttling valve, etc.) at one or more of the ports 310.

One or more sensors 312 are coupled to the chamber 302. In some embodiments, one or more sensors 312 are disposed within the chamber 302 (e.g., in the interior volume 308). In some embodiments, one or more sensors 312 are coupled to the chamber via one or more ports 310 (e.g., a port 310 allows gas flow from the interior volume 308 to a sensor 312 disposed outside of the interior volume 308). In some embodiments, the sensors 312 include one or more of an oxygen sensor configured to indicate a current oxygen level, a moisture sensor configured to indicate a current moisture level, a gas sensor configured to indicate a current amount of gas (e.g., one or more of oxidation inhibiting gas, hydrogen, ammonia, inert gas, or the like), a temperature sensor configured to indicate a current temperature associated with the interior volume 308, a pressure sensor configured to indicate a current pressure associated with the interior volume 308, a flow rate sensor configured to indicate a current gas flow rate associated with the chamber 302, an actuation sensor configured to indicate the state of the door 306 (e.g., open, closed, transitioning between open and closed, etc.), or the like.

In some embodiments, the processing system 300 includes a recirculation device 320 (e.g., recirculation pump, recirculation fan, recirculation filter, etc.), an exhaust device 322 (e.g., an exhaust pump), and one or more supply devices 324 (e.g., inlet valve, input pump, etc.). A processing device (e.g., controller 109 of FIG. 1, a processing device, a server device, processing logic, etc.) controls one or more of the recirculation device 320, the exhaust device 322, or supply device(s) 324 (e.g., based on sensor data from the sensors 312).

The recirculation device 320 recirculates gas within the interior volume 308. In some embodiments, the recirculation device 320 pulls the gas through a first port 310 (e.g., outlet) from the interior volume 308 via recirculation piping 330 and input the gas through a second port 310 (e.g., inlet, opposite the first port 310) into the interior volume. In some embodiments, the recirculation device 320 (e.g., a recirculation fan) recirculates the gas within the interior volume 308 (e.g., without the gas exiting the interior volume 308) by mixing the gas within the interior volume 308.

In some embodiments, the processing system 300 includes an exhaust device 322 that exhausts gas from the interior volume 308 via exhaust piping 332. In some embodiments, the exhaust device 322 pulls the gas through a port 310 connected to the exhaust piping 332.

In some embodiments, the processing system 300 includes one or more supply devices 324 that are coupled to one or more gas supplies 340 via input piping 334. In some embodiments, each gas supply 340 provides one or more of an oxidation inhibiting gas (e.g., hydrogen, ammonia, etc.) or an inert gas (e.g., nitrogen, argon, neon, helium, krypton, xenon, etc.) to the chamber 302 to the interior volume 308. In an example, gas supply 340A provides up to 5% hydrogen and gas supply 340B provides a remaining balance (e.g., 95% to 100%) of nitrogen to the chamber 302. In some embodiments, the interior volume 308 includes a gas mixture (e.g., a forming gas) that is up to 5% oxidation inhibiting gas (e.g., hydrogen). In some embodiments, the one or more ports 310 coupled to the one or more supply devices 324 provide up to 5% oxidation inhibiting gas (e.g., hydrogen) to the interior volume 308.

In some embodiments, the supply devices 324 are coupled to ports 310 (e.g., inlets, an oxidation inhibiting gas inlet configured to receive an oxidation inhibiting gas into the chamber 302, an inert gas inlet configured to receive an inert gas into the chamber 302, etc.) via the input piping 334 (e.g., a first portion of input piping 334 runs between the gas supply 340 and the supply device 324 and a second portion of input piping 334 runs between the supply device 324 and port 310). In some embodiments, the supply device 324 is a pump configured to pump gas from the gas supply 340 to the interior volume 308. In some embodiments, the supply device 324 is a valve (e.g., gas in the gas supply 340 is pressurized) that is configured to actuate (e.g., open) to provide gas to the interior volume 308.

FIGS. 3A-D illustrate two gas supplies 340A-B. In some embodiments, there is one gas supply 340 (e.g., a mixture of inert gas and an oxidation inhibiting gas, just an oxidation inhibiting gas, etc.). In some embodiments, there are more than two gas supplies 340.

The processing device provides a gas flow (e.g., via recirculation device 320, via supply device 324) including an oxidation inhibiting gas (e.g., up to 5% of the gas flow is oxidation inhibiting gas) into the chamber 302. The processing device receives, via one or more sensors 312, sensor data. The sensor data indicates one or more of current oxygen level within the chamber 302, current moisture level within the chamber 302, state of the door 306, temperature associated with the chamber 302, or the like. The processing device determines, based on the sensor data, whether to perform an adjustment of a current amount of oxidation inhibiting gas entering the chamber 302. Responsive to determining to perform an adjustment, the processing device causes the adjustment of the current amount of oxidation inhibiting gas entering the chamber 302. In some embodiments, the processing device causes the adjustment by controlling (e.g., actuating) the supply device 324 coupled to the gas supply 340 (e.g., oxidation inhibiting gas supply). In some embodiments, the processing device further controls (e.g., operates) the exhaust device 322 (e.g., exhaust the recirculated mixed gas in the chamber 302 and input non-recirculated oxidation inhibiting gas into the chamber 302). The chamber 302 is configured to be placed in a closed position relative to an adjacent chamber (e.g., factory interface) under first conditions (e.g., transportation of the chamber 302, processing of a substrate within the chamber 302) and/or an open position relative to an adjacent chamber (e.g., factory interface) under second conditions (e.g., transferring the substrate from the chamber 302 to the adjacent chamber).

In some embodiments, the processing device causing the gas flow includes recirculating existing gas from the chamber back into the chamber and the processing device causing of the adjustment of the current amount of the oxidation inhibiting gas entering into the chamber includes changing a first rate of non-recirculated oxidation inhibiting gas entering the chamber. In some embodiments, the first rate of the non-recirculated oxidation inhibiting gas entering the chamber is changed independent of a second rate of non-recirculated inert gas entering the chamber. In some embodiments, the processing device causes a second amount of inert gas entering into the chamber to be adjusted at a same rate as the adjustment of the current amount of the oxidation inhibiting gas entering into the chamber. In some embodiments, responsive to determining the adjacent chamber has changed from a closed position to an open position relative to the factory interface, the processing device causes a second adjustment of the current amount of the oxidation inhibiting gas entering into the adjacent chamber.

The processing device causes oxidation inhibiting gas (e.g., cause up to 5% hydrogen) to be combined with an inert gas (e.g., nitrogen, such as $N_2$) to create a forming gas in the sealed environment of the chamber 302 (e.g., sealed factory interface, sealed FOUP, sealed load lock system, sealed load port, sealed cooling station, sealed storage area, sealed metrology station, etc.). In some embodiments, the forming gas is a mixture of hydrogen and nitrogen. The oxidation inhibiting gas and/or forming gas increases device performance and yield (DPY). In some conventional systems, substrates oxidize in the factory interface and/or chambers adjacent to the factory interface and substrates at higher temperatures oxidize at higher rates, so substrates are conventionally allowed to cool prior to being transferred to the factory interface and adjacent chambers to lessen oxidation, which decreases DPY. The oxidation inhibiting gas and/or forming gas in chambers 302 allow substrates at increased temperatures to be transferred to chambers 302 (e.g., factory interface, enclosure system, etc.) without being oxidized, which increases DPY. Substrates enter the chamber 302 prior to being processed and/or after being processed.

In some embodiments, the processing device controls the ratio of oxidation inhibiting gas to inert gas in the chamber 302. In some embodiments, the processing device controls the amount of oxygen and/or moisture in the chamber 302 by controlling the amount of oxidation inhibiting gas and/or inert gas associated with (e.g., entering, in, recirculated in, supplied to, exhausted from, etc.) the chamber 302.

In some embodiments, the processing device causes oxidation inhibiting gas to be input into the chamber 302 (e.g., up to 100% oxidation inhibiting gas). In some embodiments, the processing device causes oxidation inhibiting gas (e.g., up to 5% oxidation inhibiting gas) and inert gas (e.g., noble gas, carrier gas, non-reactive gas, an inert gas that has a triple bond, etc.) to be input into the chamber 302. In some embodiments, the processing device causes oxidation inhibiting gas and compressed dry air (CDA) to be input into the chamber 302.

In some embodiments, the interior volume 308 of the chamber 302 is maintained at a positive pressure relative to the exterior of the chamber. In some embodiments, leakage occurs via opening of doors, via sealing members, and/or the like. In some embodiments, the control device 119 provides gas flow that is greater than the leakage and exhaust rate (e.g., via exhaust device 322). For example, initially (e.g., upon startup of a chamber 302), a higher amount (e.g., 500 liters per minute (L/min)) of gas flow is provided to the chamber 302 to flush out atmospheric air (e.g., flush out oxygen, flush out atmospheric contaminants) in the chamber 302. Once the oxygen and/or moisture levels are below a threshold amount (e.g., 100-300 ppm of oxygen and/or moisture, 1-5 ppm of oxygen and/or moisture, etc.), a lower amount (e.g., 50-80 L/min, 100-125 L/min) of gas flow is provided to the chamber 302 which is greater than a leakage rate (e.g., 40-80 L/min) and exhaust rate (e.g., 5-10% of the gas flow). The processing device receives sensor data from sensors 312 to dynamically change the gas flow rate (e.g., of the oxidation inhibiting gas, of the oxidation inhibiting gas and inert gas, etc.) based on the amount of oxygen and/or moisture in the chamber 302. For example the oxidation inhibiting gas flow rate is lowered as the oxygen and/or moisture levels lower and the oxidation inhibiting gas flow rate is increased as the oxygen and/or moisture levels increase (e.g., multiple oxidation inhibiting gas flow rates, where each oxidation inhibiting gas flow rate corresponds to a corresponding threshold level of oxygen and/or moisture).

The amount of oxidation inhibiting gas (e.g., hydrogen, ammonia) associated with the chamber 302 (e.g., in the chamber 302, entering the chamber) is a percentage of the gas flow into the chamber 302. In some embodiments, the gas flow includes oxidation inhibiting gas and inert gas (e.g., the gas flow only includes the oxidation inhibiting gas and the inert gas). In some embodiments, the amount of oxidation inhibiting gas (e.g., in the gas flow into the chamber 302, in the chamber) is below 5% (e.g., 0-5%) of the total amount of gas in the gas mixture. In an example, if gas flow into the chamber 302 is 50 L/min, in some embodiments, the amount of oxidation inhibiting gas entering the chamber 302 is 2.5 L/min and the amount of inert gas entering the chamber 302 is 47.5 L/min. In some embodiments, the amount of oxidation inhibiting gas is 0.5%-5%. In some embodiments, the amount of oxidation inhabiting gas is 2.5%-5%, or 1%-4%, or 3%-5%, or 3.5%-5%, or 2%-10%, or 5%-10%, or 0.5%-2.5%, or 0.5%-4%, or other percentage of the total gas in a gas mixture. In some embodiments, the amount of oxidation inhabiting gas is above 0% to 100%.

The oxidation inhibiting gas performs gettering of the oxygen and/or moisture. Oxygen and/or moisture that enters the chamber 302 (e.g., via leaking, via opening of a door, etc.) is gettered by the oxidation inhibiting gas reacting with the oxygen and/or moisture and the resulting product (e.g., molecules of water) is inert and is swept away to inhibit forward reacting of oxidation. The oxidation inhibiting gas creates a reducing environment to push back the oxygen to prevent reaction of substrate with oxygen. In some embodiments, the substrates in chamber 302 do not have exposure to oxygen and/or moisture (e.g., do not oxidize) responsive to the gas flow including oxidation inhibiting gas.

In some embodiments, a chamber 302 includes a fan filter unit to cause flow of gas within the chamber 302 (e.g., to cause gas flow from the top of the chamber 302 to the bottom of the chamber 302) to cause substrates in the interior volume 308 to be exposed to the oxidation inhibiting gas. In some embodiments, gas flow into the interior volume 308 is at one or more first locations and gas flow out of the interior volume 308 is at one or more second locations (e.g., opposite at least one of the one or more first locations) so that substrates in the interior volume 308 are exposed to the gas flow (e.g., the oxidation inhibiting gas).

In some embodiments, the chamber 302 includes one or more throttle valves (e.g., at one or more ports 310) to dynamically control gas flow into and/or exhaust out of the interior volume 308 based on the amount of pressure maintained in the chamber 302.

Figure 3A:
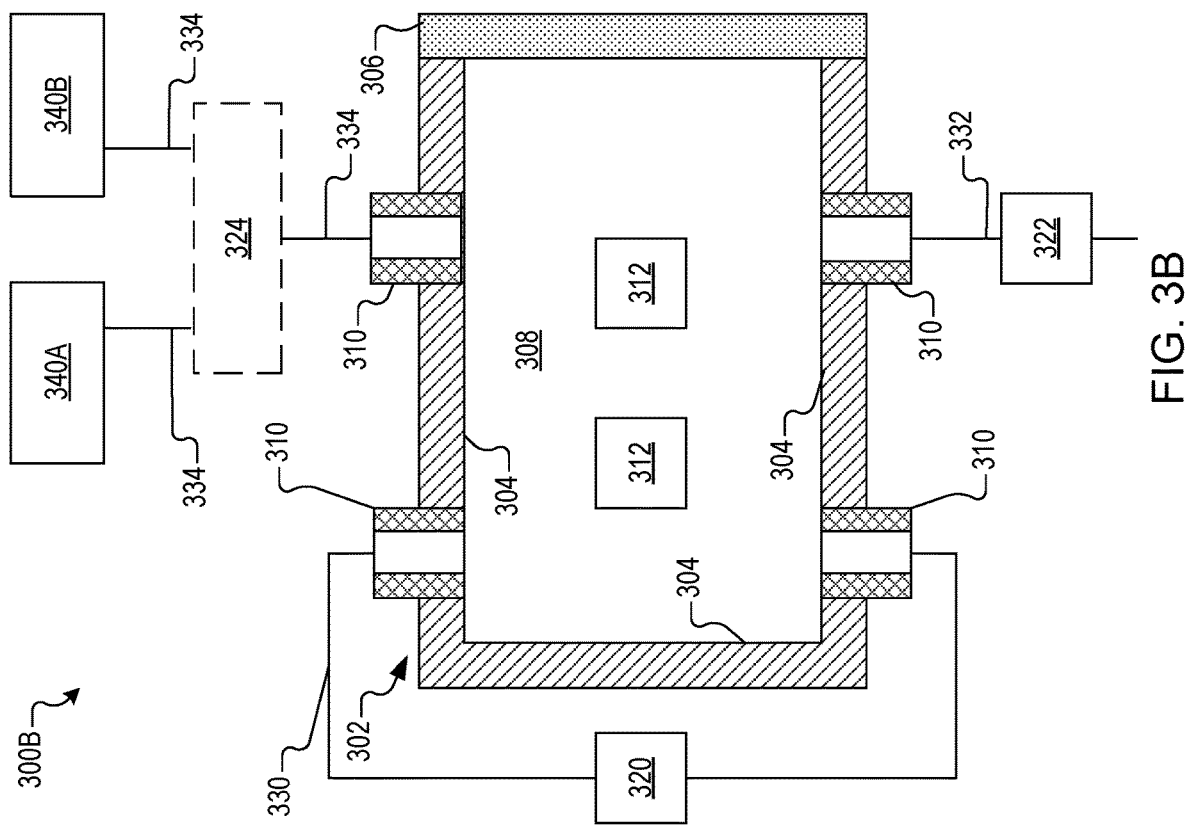
FIGS. 3A-D illustrates cross-sectional views of chambers of processing systems, according to certain embodiments.

Referring to FIG. 3A, in some embodiments, the processing system 300A has a corresponding supply device 324 and port 310 for each gas supply 340. In some embodiments, the supply devices 324 are controlled independently (e.g., amount of oxidation inhibiting gas entering the interior volume 308 changes independent of the amount of inert gas entering the interior volume 308). In some embodiments, the supply devices 324 are controlled simultaneously (e.g., the amount of inert gas and the amount of oxidation inhibiting gas entering the interior volume 308 change at the same rate). In processing system 300A, the exhaust device 322 is coupled to corresponding port 310 (e.g., an exhaust outlet port).

Figure 3B:
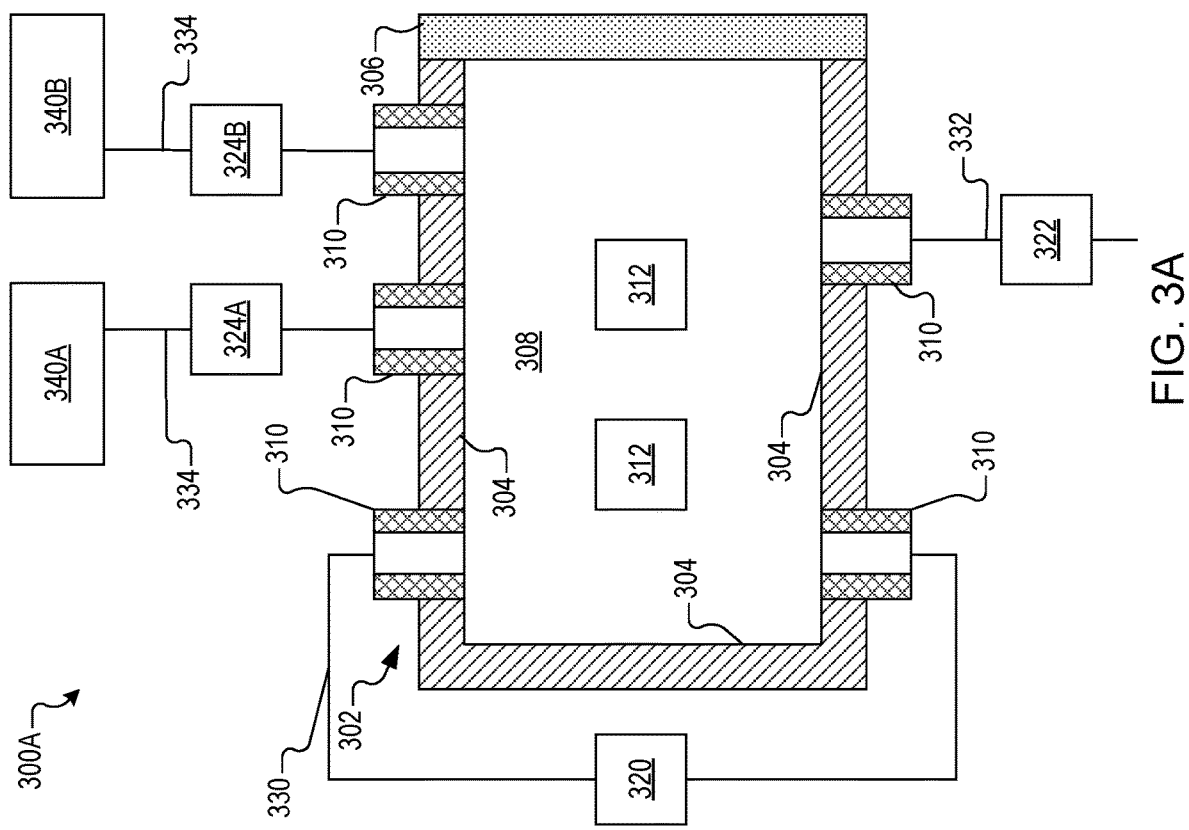

Referring to FIG. 3B, in some embodiments, the processing system 300B mixes the gases from two or more gas supplies 340 via supply device 324 and the mixed gas is input via a single port 310 (e.g., mixed gas inlet). In some examples, separate input piping 334 is routed from each gas supply 340 to the supply device 324 and common input piping 334 is be routed from the supply device 324 to the port 310. In some embodiments, supply device 324 includes a pump and/or valve for each gas supply and a mixing chamber (e.g., disposed between the pumps and/or valves and the port 310). In some embodiments, the pumps and/or valves of supply device 324 are controlled independently. In some embodiments, the pumps and/or valves of supply device 324 are controlled simultaneously.

Figure 3D:
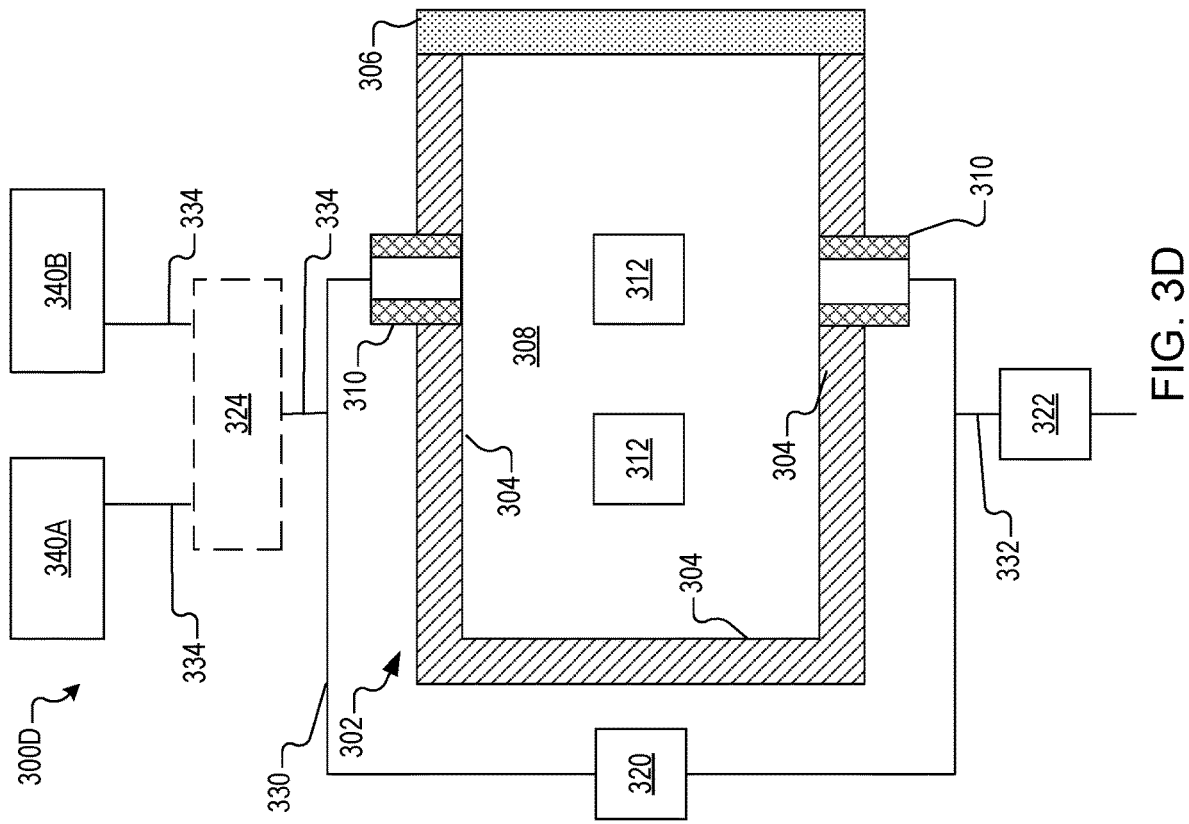
Figure 3C:
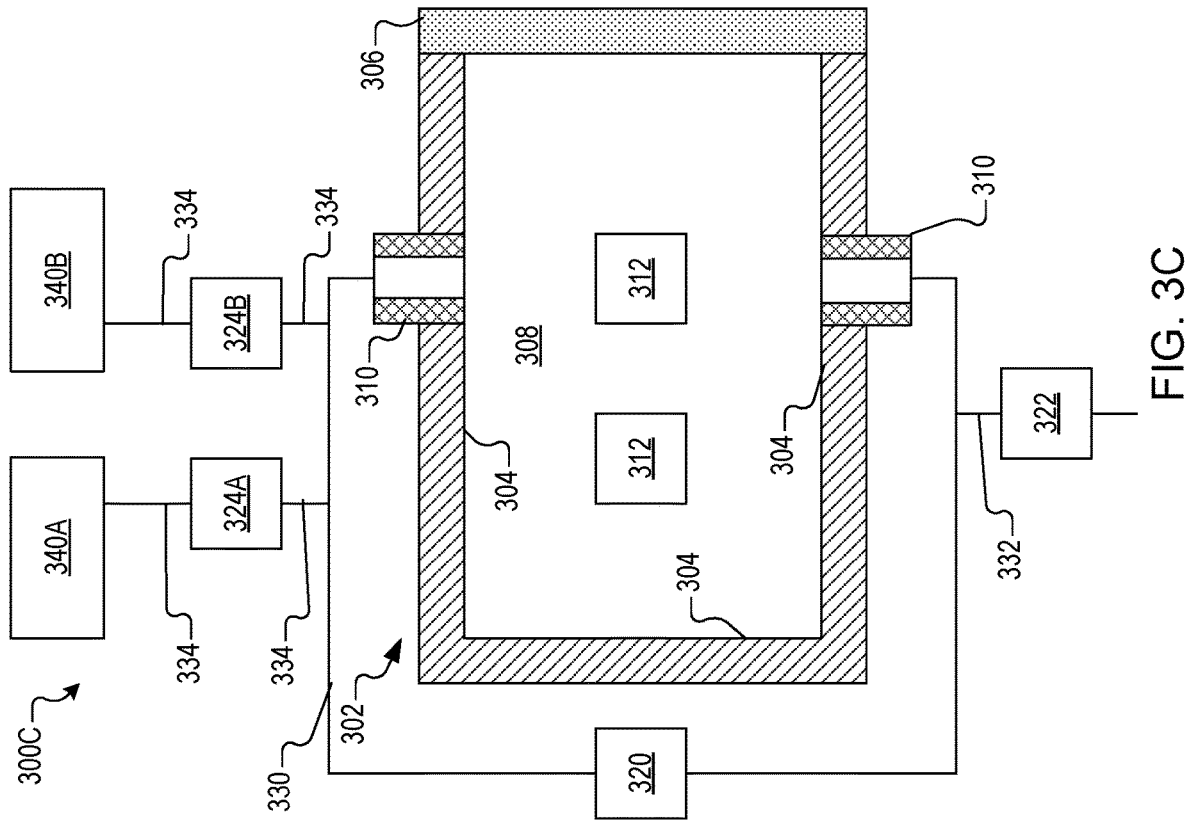

Referring to FIGS. 3C-D, in some embodiments, the input piping 334 and/or the exhaust piping 332 is coupled to the recirculation piping 330. In some embodiments, the new gas from one or more gas supplies 340 is provided to the interior chamber via the recirculation piping 330 and the port 310 coupled to the recirculation piping 330. In some embodiments, the exhaust gas is removed from the recirculation piping 330.

Figure 4A:
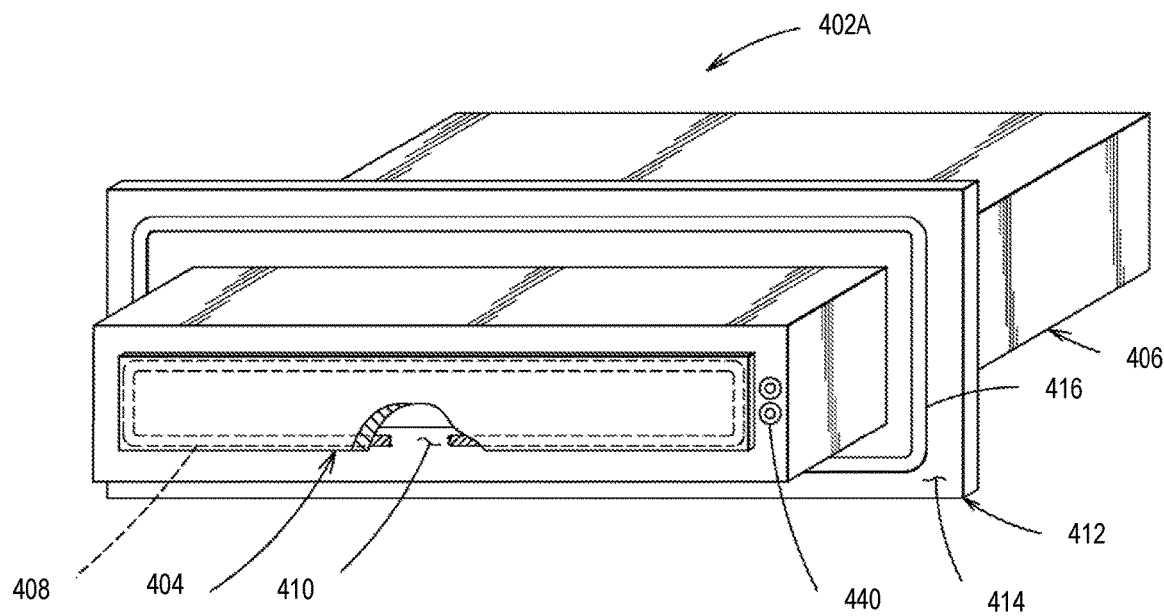
FIG. 4A illustrates a perspective view of a sealed enclosure system, according to certain embodiments.
Figure 4B:
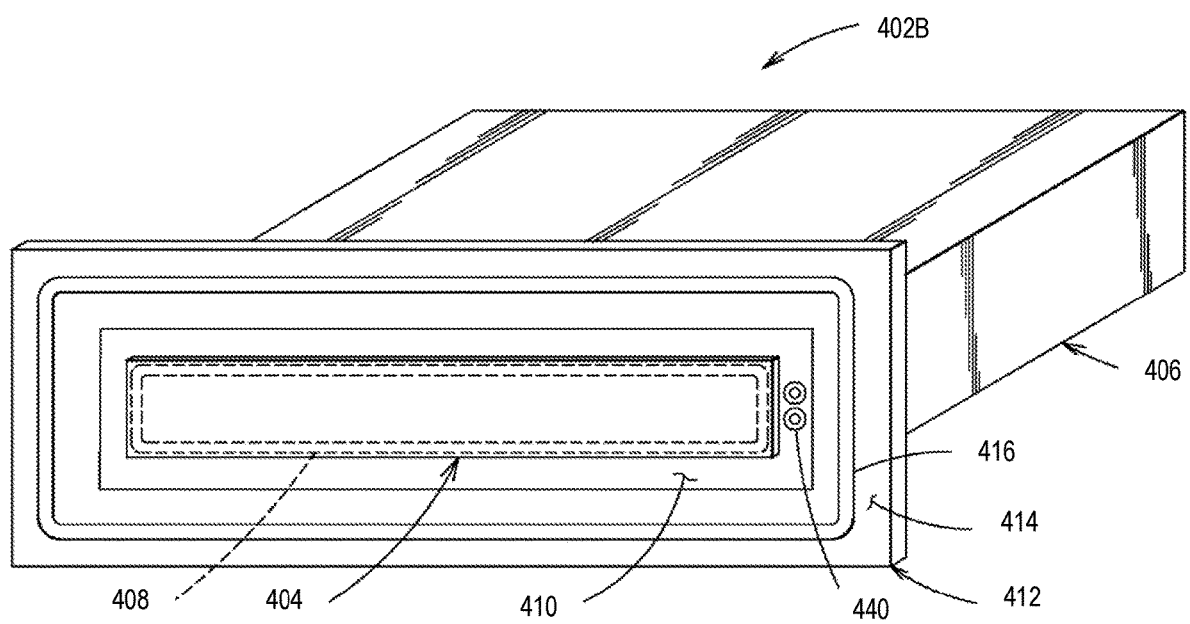
FIG. 4B illustrates a perspective view of a sealed enclosure system, according to certain embodiments.

FIGS. 4A-B illustrate perspective views of enclosure systems 402A-B (e.g., sealable enclosure system, enclosure system 102 of FIG. 1, enclosure system 202 of FIG. 2), according to certain embodiments. In some embodiments, description of the enclosure systems 402A-B of FIGS. 4A-B applies to other chambers (e.g., factory interface, load lock system, load port, cooling station, storage area, transfer chamber, processing chamber, metrology station, or the like) of the processing system.

The enclosure system 402 includes a door 404 (e.g., door 230 of FIG. 2) coupled to a main body 406 which forms an internal cavity adapted to receive content (e.g., substrates, wafers, glass plates, etc.). The door 404 is to be selectively removed (e.g., opened) to allow access to a cavity inside the region of the main body 406 where one or more items of content are stored. The door 404 is selectively attached to the main body 406 to hermetically seal and/or vacuum seal the door 404 against the main body 406. In some embodiments, the door 404 and/or main body 406 includes a resilient sealing member 408 (e.g., O-ring) that compresses and seals the door 404 against the sealing surface 410 of the main body 406. In some embodiments, one or more other configurations for sealing the door 404 relative to the main body 406 are employed.

In some embodiments, substrate support features such as recessed shelves or slots are employed to securely hold each substrate within the main body 406. In some embodiments, one or more other supporting, clamping, retaining, or similar features are employed to secure each substrate within the main body 406.

In some embodiments, the main body 406 includes an outer flange 412 which extends outward from the main body 406 in a radial direction. In some embodiments, the outer flange provides a sealing surface 414 for a corresponding surface feature of a system component to which the enclosure system 202 interfaces, such as a load port, loadlock system, or other location. In some embodiments, the sealing surface 414 includes a resilient sealing member 416 (e.g., O-ring, seal integrally bonded to sealing surface 414) for creating a substantially airtight and/or vacuum seal. In some embodiments, the corresponding surface feature of a component to which the enclosure system 202 docks (e.g., load port, loadlock system, or other location) includes a sealing member. In some embodiments, the outer flange 412 is located at a middle region of the main body 406 (e.g., FIG. 4A). In some embodiments, the outer flange 412 is located anywhere along the length of the main body 406. In some embodiments, the outer flange 412 is located at or near a front of the carrier (e.g., near the door 404, see FIG. 4B). In some embodiments, the enclosure system 402 does not include an outer flange 412 and a surface feature of a system component to which the enclosure system 402 docks (e.g., load port, loadlock system, or other location) seals directly against a surface of the enclosure system 402, such as along a frontal sealing surface 410 of the main body 406 or at any other location along the main body 406, such as around a peripheral surface thereof.

Enclosure system 402 includes one or more ports 440 (e.g., ports 240 of FIGS. 2A-B, ports 310 of FIGS. 3A-D) for evacuating and/or filling the enclosure system 202 with gas such as an inert gas, a non-reactive gas, and/or an oxidation inhibiting gas. In some embodiments, the ports 440 include valves, such as poppet valves, gate valves, or ball valves, which are selectively closed after evacuating and/or filling the enclosure system 402.

Figure 5A:
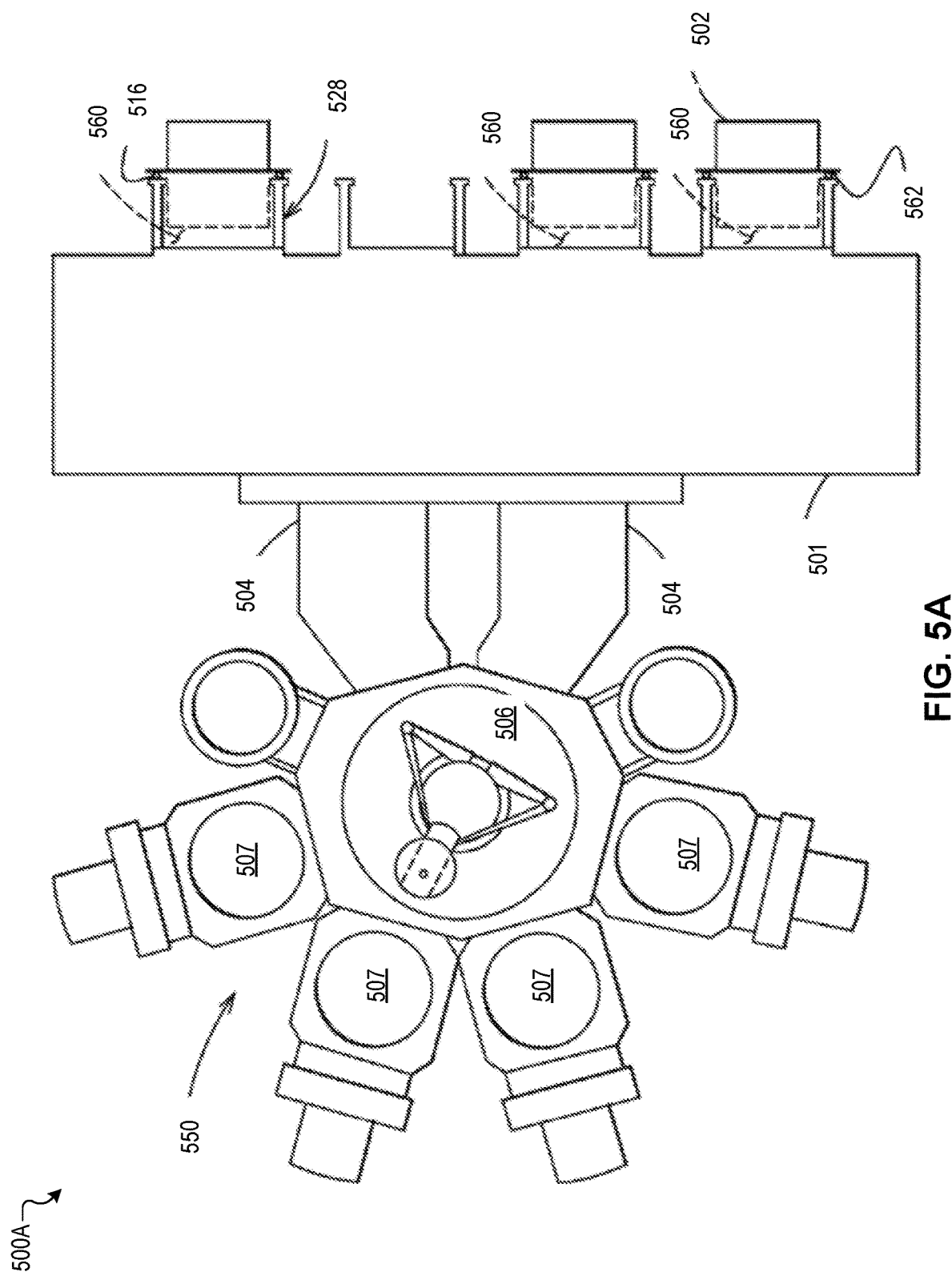
FIG. 5A illustrates a processing system that has a factory interface interfacing with a sealed enclosure system, according to certain embodiments.
Figure 5B:
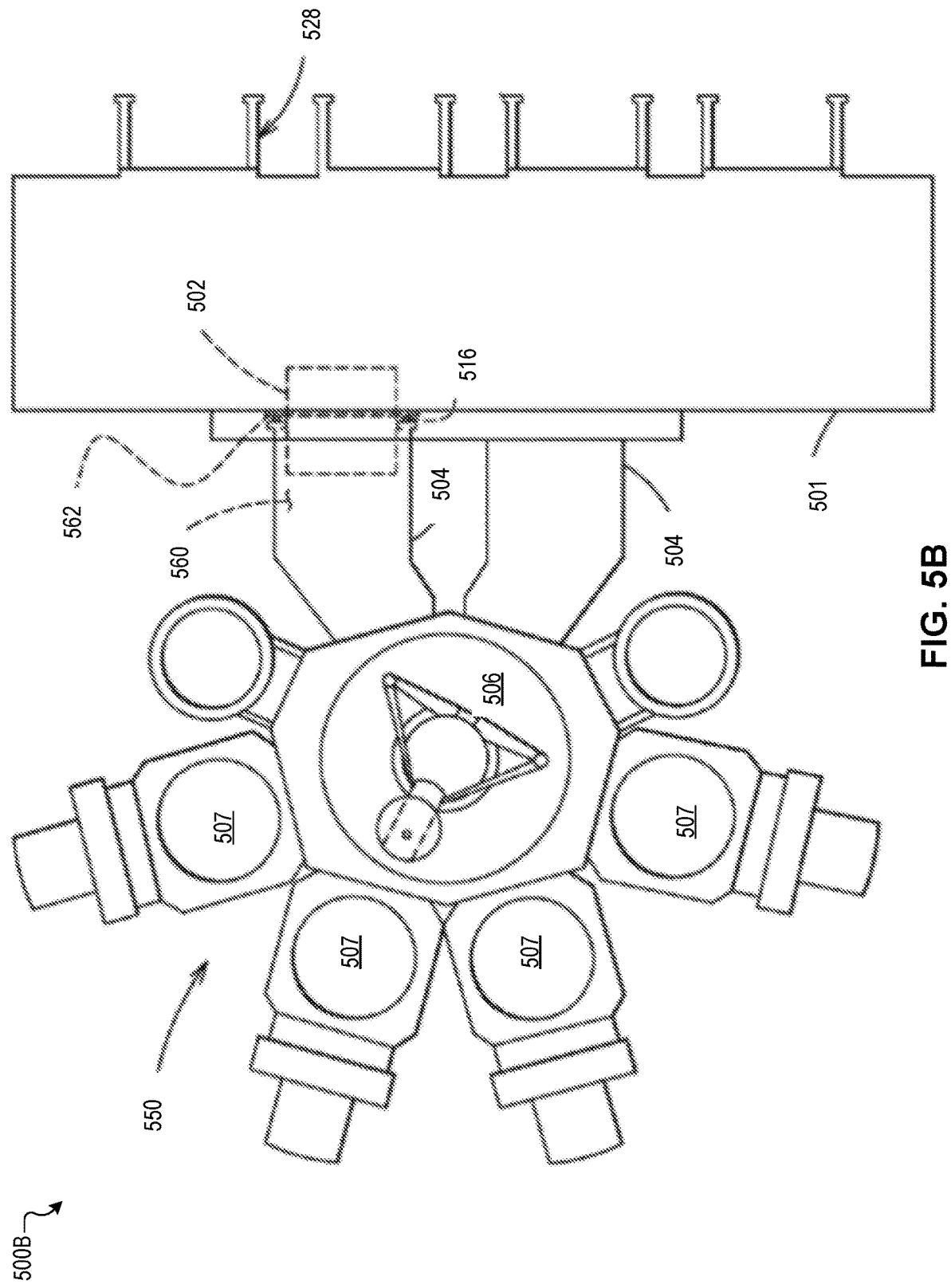
FIG. 5B illustrates a processing system that has a load lock chamber interfacing with a sealed enclosure system, according to certain embodiments.

FIG. 5A illustrates a processing system 500A that has a factory interface 501 (e.g., factory interface 101 of FIG. 1, factory interface 201 of FIGS. 2A-B) interfacing with an enclosure system 502 (e.g., enclosure system 102 of FIG. 1, enclosure system 202 of FIGS. 2A-B, enclosure systems 402A-B of FIGS. 4A-B), according to certain embodiments. FIG. 5B illustrates a processing system 500B that has a loadlock system 504 (e.g., loadlock system 104 of FIG. 1, loadlock system 204 of FIGS. 2A-B) interfacing with an enclosure system 502 (e.g., enclosure system 102 of FIG. 1, enclosure system 202 of FIGS. 2A-B, enclosure systems 402A-B of FIGS. 4A-B), according to certain embodiments. In some embodiments, description of the factory interface 501 interfacing with an enclosure system 502 and loadlock system 504 interfacing with an enclosure system 502 of FIGS. 5A-B applies to other chambers that are adjacent to each other (e.g., enclosure system, factory interface, load lock system, load port, cooling station, storage area, transfer chamber, processing chamber, metrology station, or the like) of the processing system.

The processing systems 500A-B include a processing tool 550 having a system component such as a loadlock system 504 coupled to one or more processing chambers 507 by a transfer chamber 506. Each processing chamber 507 is adapted to perform an electronic device manufacturing process on a substrate. The processing systems 500A-B include a factory interface 501 coupled to the processing tool 550 and to one or more load ports 528 coupled to the factory interface 501.

Manufacturing of content (e.g., electronic devices, substrates, wafers) involves performing a sequence of procedures with respect to a substrate such as a silicon substrate, a glass plate, a polymer substrate, etc. (In some embodiments, the substrates are also referred to as wafers, whether patterned or unpatterned.) In some embodiments, the procedures include one or more of polishing, deposition, etching, photolithography, heat treatment, or the like. In some embodiments, a number of different processing procedures are performed in a single processing system or "tool" which includes a plurality of processing chambers. In some embodiments, the other processes are performed at other processing locations within a fabrication facility, and substrates are transported within the fabrication facility from one processing location to another. Depending upon the type of content to be manufactured, in some embodiments, there are a relatively large number of processing procedures to be performed at different processing locations within the fabrication facility.

Substrates are transported from one processing location to another within enclosure systems (e.g., substrate carriers, pods, cassettes, containers, or the like). Automated transport devices, such as automatic guided vehicles, overhead transport systems, substrate carrier handling robots, etc., are used to move enclosure systems from location to location within the fabrication facility or to transfer enclosure systems from or to a transport device.

In some embodiments, a chamber (e.g., enclosure system, etc.) is configured to be sealed. The sealed chambers are hermetically and/or vacuum sealed to reduce and/or prevent exposure of substrates stored within the chamber to one or more of particulates, contaminants, oxidants, other reactive species, or the like. In some embodiments, a chamber is evacuated to a particular vacuum level and/or filled with a particular gas (e.g., to a particular pressure, with a particular mixture of gas, etc.). For example, an enclosure system is evacuated and/or filled with a gas prior to transportation, opening, and/or closing of the enclosure system. In some embodiments, the gas includes an oxidation inhibiting gas and/or an inert or otherwise non-reactive gas such as nitrogen, argon, etc. In some embodiments, the substrates stored within the enclosure system are transported without being exposed to particulates, contaminants, oxidants or other undesirable substances during transport and/or prior to or after processing.

In some embodiments, one or more apparatus are provided for opening, closing, pumping, purging, loading and/or unloading chambers. For example, a system component, such as a load port of a processing tool (e.g., of a factory interface) is adapted to create a sealed environment around all or a portion of a sealed enclosure system (such as a door of the sealed enclosure system). The sealed environment at the chamber then is substantially equalized with the environment in the sealed chamber. For instance, in embodiments in which the enclosure system is evacuated to a predetermined vacuum level after loading with substrates, the sealed environment outside the enclosure system (e.g., at the component) is considered substantially equalized if evacuated to a substantially similar vacuum level before a door of the enclosure system is opened. In some embodiments, this is accomplished by one or more pump-purge cycles. By substantially similar, it is meant that vacuum levels are substantially the same (e.g., varies from each other by about 10% or less).

In some embodiments, a chamber contains an inert gas and the sealed environment adjacent to the chamber is considered substantially equalized when the chamber and the sealed environment adjacent to the chamber are filled with a substantially similar gas (e.g., gases of the same type). In some embodiments, the inert gases and/or nonreactive gases are provided at substantially the same temperature and pressure in the chamber and the sealed environment adjacent to the chamber before a door of the chamber is opened. In some embodiments, a temperature of the gases are up to about 20% different, and the absolute pressure of the gas in the chamber and the absolute pressure of the gas in the sealed environment adjacent to the chamber are up to about 10% different.

In the case of an inert gas and non-reactive gas mixtures, in some embodiments, the molar percent of each gas in the mixtures is substantially the same. In some embodiments, the molar percentages of the gases are up to about 5% different.

In some embodiments, the chamber or the sealed environment adjacent to the chamber is a load lock chamber of a processing tool and the load lock chamber is adapted to create a sealed environment around all or a portion of a sealed enclosure system (such as a door of the sealed enclosure system). The sealed environment at the load lock chamber then is equalized with the environment in the sealed enclosure system. In some embodiments, the enclosure system is evacuated to a predetermined vacuum level after loading and the sealed environment at the load lock chamber is evacuated to a similar vacuum level before a door of the enclosure system is opened. In some embodiments, the enclosure system contains an oxidation inhibiting gas and/or an inert gas and the sealed environment at the load lock chamber is filled with a similar gas mixture (e.g., via one or more pump-purge cycle(s)) before a door of the enclosure system is opened.

In some embodiments, the present disclosure is employed with different sized chambers. In some examples, the present disclosure is employed with both large lot and small lot size enclosure systems (e.g., substrate carrier). In some embodiments, the term "small lot size" substrate carrier or "small lot" carrier refers to an enclosure system that is adapted to hold fewer substrates than a conventional "large lot size" carrier which typically holds thirteen or twenty-five substrates. In some examples, a small lot size carrier is adapted to hold a maximum of twelve or fewer substrates. In some examples, a small lot size carrier is adapted to hold a maximum of five or less substrates. In some embodiments, other small lot size carriers are employed (e.g., small lot size carriers that hold a maximum of one, two, three, four or more than five substrates, but less than that of a large lot size carrier). In some examples, each small lot size carrier holds too few substrates for human transport of carriers to be commercially viable within an electronic device or other manufacturing facility. In some embodiments, mechanized/automated transport of small lot size carriers is employed.

In some embodiments, each load port 528 is adapted to support an enclosure system 502 (e.g., substrate carrier containing one or more substrates, enclosure system 102 of FIG. 1, enclosure system 202 of FIGS. 2A-B, enclosure system 402 of FIGS. 4A-B). The factory interface 501 is adapted to transfer substrates from an enclosure system 502 to the loadlock system 504 of the processing tool 550 via a substrate handler or other robot (e.g., factory interface robot 111 of FIG. 1, robot arm 211 of FIGS. 2A-B, etc.). In some embodiments, each of one or more portions of the processing system 500A is adapted to create a sealed environment 560 and to equalize the sealed environment 560.

Referring to FIG. 5A, a load port 528 is adapted to create a sealed environment 560 relative to at least a portion of an enclosure system 502 and to equalize the sealed environment 560 with an environment within the enclosure system 502. In some embodiments, a flange (e.g., flange 412 of FIGS. 4A-B) of enclosure system 502 provides the sealing surface (e.g., sealing surface 414 of FIGS. 4A-B) against which a corresponding surface feature 562 of the load port 528 is to seal. In some embodiments, the sealing surface (e.g., sealing surface 414 of FIGS. 4A-B) of enclosure system 502 includes a resilient sealing member 516 (e.g., resilient sealing member 416 of FIGS. 4A-B). In some embodiments, the surface feature 562 of a load port 528 includes a resilient sealing member.

In some embodiments, the enclosure system 502 is evacuated to a predetermined vacuum level after loading of the substrates and the sealed environment 560 at the load port 528 is substantially equalized by being evacuated to a similar vacuum level before a door of the enclosure system 502 is opened. In some embodiments, the enclosure system 502 contains one or more types of gas and the sealed environment 560 at a load port 528 is filled with a similar one or more types of gas (e.g., via one or more pump-purge cycles) before the door of the enclosure system 502 is opened. In some embodiments, the environment is equalized by changing a vacuum level in the enclosure system 502 and/or changing the one or more types of gas in the enclosure system 502 to be substantially equal to the sealed environment 560.

Referring to FIG. 5B, a loadlock system 504 is adapted to create a sealed environment 560 relative to at least a portion of an enclosure system 502 and to substantially equalize the sealed environment 560 with an environment within the enclosure system 502. In some embodiments, a flange (e.g., flange 412 of FIGS. 4A-B) of enclosure system 502 provides a sealing surface (e.g., sealing surface 414 of FIGS. 4A-B) against which a corresponding surface feature of the loadlock system 504 is to seal. In some embodiments, the sealing surface (e.g., sealing surface 414 of FIGS. 4A-B) of enclosure system 502 includes a resilient sealing member (e.g., resilient sealing member 416 of FIGS. 4A-B). In some embodiments, the surface feature 562 of the loadlock system 504 includes the resilient sealing member.

In some embodiments, the enclosure system 502 is evacuated to a predetermined vacuum level after loading of the substrates and the sealed environment 560 at the loadlock system 504 is substantially equalized by being evacuated to a similar vacuum level before a door (e.g., of the enclosure system 502, of the loadlock system 504) is opened. In some embodiments, the vacuum level of the enclosure system 502 is changed to be substantially equal to a vacuum level of the sealed environment. In some embodiments, the enclosure system 502 contains one or more types of gas and the sealed environment 560 at a loadlock system 504 is filled with a similar one or more types of gas (e.g., via one or more pump-purge cycles) before the door of the enclosure system 502 is opened. In some embodiments, the environment is equalized by changing a vacuum level in the enclosure system 502 and/or changing the one or more types of gas in the enclosure system 502 to be substantially equal to the sealed environment 560.

Figure 6:
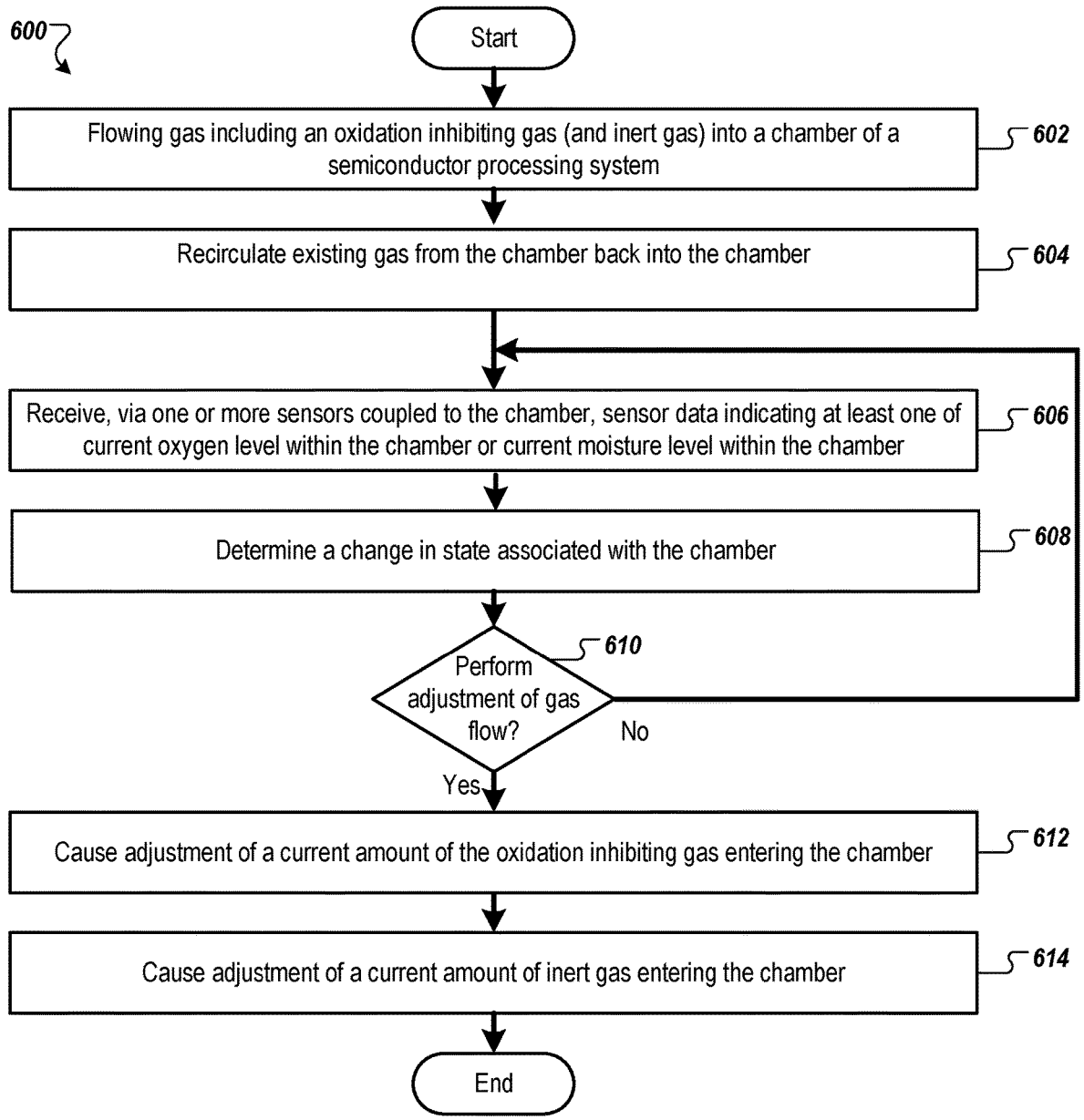
FIG. 6 illustrates a method of using oxidation inhibiting gas in a manufacturing system, according to certain embodiments.

FIG. 6 illustrates a method 600 of using oxidation inhibiting gas in a manufacturing system, according to certain embodiments. Method 600 is performed by processing logic that includes hardware (e.g., circuitry, dedicated logic, programmable logic, microcode, processing device, etc.), software (such as instructions run on a processing device, a general purpose computer system, or a dedicated machine), firmware, microcode, or a combination thereof. In some embodiments, method 600 is performed by controller 109 of FIG. 1. In some embodiments, method 600 is performed by a server device (e.g., in communication with controller 109). In some embodiments, a non-transitory storage medium stores instructions that when executed by a processing device (e.g., of controller 109, of a server device, etc.) cause the processing device to perform method 600.

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are used in every embodiment.

Referring to method 600 of FIG. 6, at block 602, processing logic flows gas including an oxidation inhibiting gas (e.g., causes gas flow including an oxidation inhibiting gas to be provided) into a chamber of a semiconductor processing system. In some embodiments, the gas flowing into the chamber includes 0.5-5% oxidation inhibiting gas and a remaining balance of an inert gas. In some embodiments, the gas flowing into the chamber includes up to 100% oxidation inhibiting gas. In some embodiments, the chamber includes one or more of a factory interface or a chamber adjacent to the factory interface (e.g., an enclosure system, load port, loadlock system, cooling station, metrology station, or storage area).

At block 604, processing logic recirculates existing gas from the chamber back into the chamber. In some embodiments, block 602 includes block 604 (e.g., the gas flowing into the chamber of block 602 includes recirculated gas flowing into the chamber, the gas flow of block 602 includes recirculated gas flowing into the chamber and non-recirculated gas flowing into the chamber, etc.). In some embodiments, block 604 is separate from block 602 (e.g., recirculation of existing gas of block 604 is different from the flowing of gas of block 602). In some examples, the flowing of gas of block 602 is flowing non-recirculated gas into the chamber at a higher rate than leakage and exhaust to provide a pressurized chamber. In some embodiments, the recirculating of existing gas of block 604 is to provide air flow to the substrates in the chamber.

At block 606, processing logic receives sensor data via one or more sensors coupled to the chamber. In some embodiments, the sensor data indicates current oxygen level and/or current moisture level within the chamber. In some embodiments, the sensor data indicates one or more of temperature (e.g., of a wafer, inside the chamber, etc.) associated with the chamber, transportation activity associated with the chamber (e.g., substrates being transferred into or out of the chamber), pressure associated with the chamber, type of gas associated with the chamber (e.g., percentage of gas in chamber that is an oxidation inhibiting gas), or the like.

At block 608, the processing device determines an occurrence of change in state associated with the chamber. In some embodiments, the change in state is a change of the chamber to a closed position, to an open position, transitioning between closed and open positions, substrates being transferred into the chamber, substrates being transferred out of the chamber, or the like. In some embodiments, the processing device determines the occurrence of the change in state via one or more sensors (e.g., door actuation sensor, motion sensor, etc.).

At block 610, the processing device determines whether to perform adjustment of gas flowing into the chamber. The processing device determines whether to perform the adjustment based on the sensor data and/or the change in state associated with the chamber. In some embodiments, the different flowing of gas into the chamber are associated with different oxygen and/or moisture levels or changes in state. Responsive to determining the oxygen and/or moisture levels or change in state are associated with a different flowing of gas into the chamber than the current flowing of gas into the chamber, the processing logic determines to perform an adjustment of gas flowing into the chamber. Responsive to determining an adjustment of gas flowing into the chamber is to be performed, flow continues to block 612. Responsive to determining an adjustment of gas flowing into the chamber is not to be performed, flow continues to block 604 (e.g., to continue monitoring the sensor data and to continue monitoring for a change in state associated with the chamber).

At block 612, the processing logic causes adjustment of a current amount of the oxidation inhibiting gas (e.g., non-recirculated oxidation inhibiting gas) entering the chamber. For example, responsive to determining an increased amount of oxygen and/or moisture in the chamber (e.g., the current amount of oxygen and/or moisture meets a first threshold), the processing logic increases the current amount of the oxidation inhibiting gas entering the chamber (e.g., to an amount that corresponds to the first threshold). In another example, responsive to determining a decreased amount of oxygen and/or moisture (e.g., the current amount of oxygen and/or moisture meets a second threshold), the processing logic decreases the current amount of the oxidation inhibiting gas entering the chamber (e.g., to an amount that corresponds to the first threshold).

At block 614, the processing logic causes adjustment of a current amount of the inert gas entering the chamber. In some embodiments, the processing logic causes the current amount of the inert gas entering the chamber to change at the same rate as the changing of the current amount of the oxidation inhibiting gas entering the chamber. In some embodiments, the processing logic causes the current amount of the oxidation inhibiting gas entering the chamber to change independent of the current amount of inert gas entering the chamber.

Figure 7:
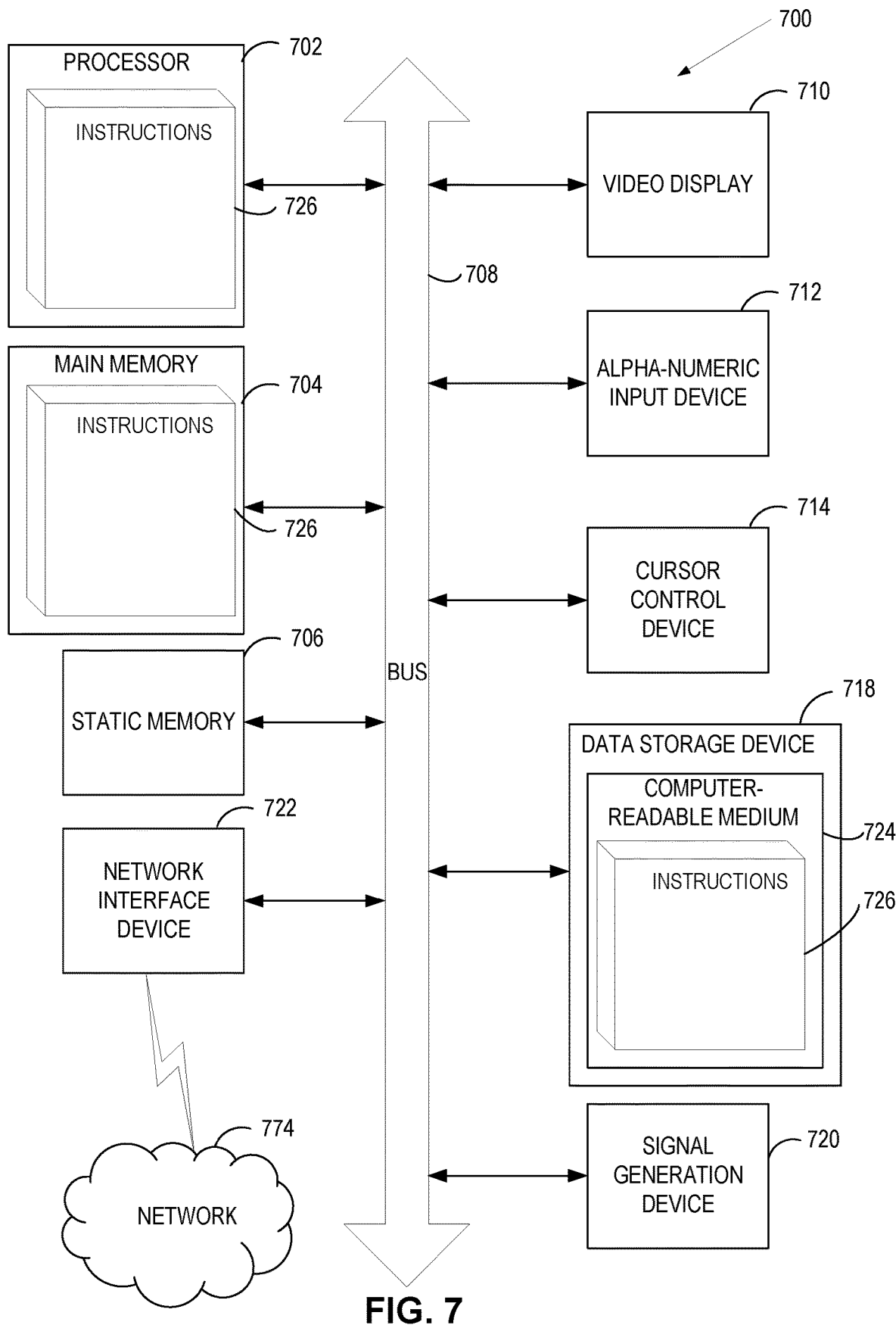
FIG. 7 is a block diagram illustrating a computer system, according to certain embodiments.

FIG. 7 is a block diagram illustrating a computer system 700, according to certain embodiments. In some embodiments, computer system 700 is controller 109 (e.g., see FIG. 1). Computer system 700 (e.g., processing device 702) is used to cause adjustment of a current amount of the oxidation inhibiting gas entering a chamber, where the chamber includes one or more of a factory interface or a chamber adjacent to the factory interface (e.g., an enclosure system, load port, loadlock system, cooling station, metrology station, or storage area).

In some embodiments, computer system 700 is connected (e.g., via a network, such as a Local Area Network (LAN), an intranet, an extranet, or the Internet) to other computer systems. In some embodiments, the computer system 700 operates in the capacity of a server or a client computer in a client-server environment, or as a peer computer in a peer-to-peer or distributed network environment. In some embodiments, the computer system 700 is provided by a personal computer (PC), a tablet PC, a set-top box (STB), a Personal Digital Assistant (PDA), a cellular telephone, a web appliance, a server, a network router, switch or bridge, or any device capable of executing a set of instructions (sequential or otherwise) that specify actions to be taken by that device. Further, the term "computer" shall include any collection of computers that individually or jointly execute a set (or multiple sets) of instructions to perform any one or more of the methods described herein.

In a further aspect, the computer system 700 includes a processing device 702, a volatile memory 704 (e.g., random access memory (RAM)), a non-volatile memory 706 (e.g., read-only memory (ROM) or electrically-erasable programmable ROM (EEPROM)), and a data storage device 716, which communicate with each other via a bus 708.

In some embodiments, the processing device 702 is provided by one or more processors such as a general purpose processor (such as, for example, a complex instruction set computing (CISC) microprocessor, a reduced instruction set computing (RISC) microprocessor, a very long instruction word (VLIW) microprocessor, a microprocessor implementing other types of instruction sets, or a microprocessor implementing a combination of types of instruction sets) or a specialized processor (such as, for example, an application specific integrated circuit (ASIC), a field programmable gate array (FPGA), a digital signal processor (DSP), or a network processor).

Computer system 700 further includes a network interface device 722 (e.g., that communicates via network 774). In some embodiments, the computer system 700 includes a video display unit 710 (e.g., an LCD), an alphanumeric input device 712 (e.g., a keyboard), a cursor control device 714 (e.g., a mouse), and a signal generation device 720.

In some implementations, data storage device 716 includes a non-transitory computer-readable storage medium 724 on which to store instructions 726 encoding any one or more of the methods or functions described herein, including instructions for implementing methods described herein (e.g., causing adjustment of a current amount of the oxidation inhibiting gas entering the chamber, and/or performing method 600 of FIG. 6).

In some embodiments, the instructions 726 reside, completely or partially, within volatile memory 704 and/or within processing device 702 during execution thereof by computer system 700, hence, volatile memory 704 and processing device 702 also constitute machine-readable storage media in some embodiments.

While computer-readable storage medium 724 is shown in the illustrative examples as a single medium, the term "non-transitory computer-readable storage medium" shall include a single medium or multiple media (e.g., a centralized or distributed database, and/or associated caches and servers) that store the one or more sets of executable instructions. The term "non-transitory computer-readable storage medium" shall also include any tangible medium that is capable of storing or encoding a set of instructions for execution by a computer that cause the computer to perform any one or more of the methods described herein. The term "non-transitory computer-readable storage medium" shall include, but not be limited to, solid-state memories, optical media, and magnetic media.

In some embodiments, the methods, components, and features described herein are implemented by discrete hardware components or are integrated in the functionality of other hardware components such as ASICS, FPGAs, DSPs or similar devices. In some embodiments, the methods, components, and features are implemented by firmware modules or functional circuitry within hardware devices. In some embodiments, the methods, components, and features are implemented in any combination of hardware devices and computer program components, or in computer programs.

Unless specifically stated otherwise, terms such as "causing," "receiving," "determining," or the like, refer to actions and processes performed or implemented by computer systems that manipulates and transforms data represented as physical (electronic) quantities within the computer system registers and memories into other data similarly represented as physical quantities within the computer system memories or registers or other such information storage, transmission or display devices. Also, the terms "first," "second," "third," "fourth," etc. as used herein are meant as labels to distinguish among different elements and, in some embodiments, do not have an ordinal meaning according to their numerical designation.

Examples described herein also relate to an apparatus for performing the methods described herein. In some embodiments, this apparatus is specially constructed for performing the methods described herein, or includes a general purpose computer system selectively programmed by a computer program stored in the computer system. In some embodiments, the computer program is stored in a computer-readable tangible storage medium.

The methods and illustrative examples described herein are not inherently related to any particular computer or other apparatus. In some embodiments, the various general purpose systems are used in accordance with the teachings described herein, or a more specialized apparatus is constructed to perform methods described herein and/or each of their individual functions, routines, subroutines, or operations. Examples of the structure for a variety of these systems are set forth in the description above.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure are practiced without these specific details. In other instances, well-known components or methods are not described in detail or are presented in simple block diagram format in order to avoid unnecessarily obscuring the present disclosure. Thus, the specific details set forth are merely exemplary. Particular implementations vary from these exemplary details and are still contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, in some embodiments, the order of operations of each method is altered so that certain operations are performed in an inverse order so that certain operations are performed, at least in part, concurrently with other operations. In another embodiment, instructions or sub-operations of distinct operations are in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
   flowing gas comprising an oxidation inhibiting gas into a chamber of a semiconductor processing system, wherein the chamber comprises one or more of a factory interface of the semiconductor processing system or an adjacent chamber that is mounted to the factory interface, wherein the flowing of the gas comprises recirculating existing gas from the chamber back into the chamber;
   receiving, via one or more sensors coupled to the chamber, sensor data indicating at least one of a current oxygen level within the chamber or a current moisture level within the chamber;
   determining, based on the sensor data, whether to perform an adjustment of a current amount of the oxidation inhibiting gas entering into the chamber; and
   responsive to determining to perform the adjustment, causing the adjustment of the current amount of the oxidation inhibiting gas entering into the chamber, wherein the causing of the adjustment of the current amount of the oxidation inhibiting gas entering into the chamber comprises changing a first rate of non-recirculated oxidation inhibiting gas entering the chamber.

2. The method of claim 1, wherein the adjacent chamber comprises one or more of:
   a substrate enclosure system;
   a loadlock system;
   a side storage pod (SSP);
   a cooling station; or
   a metrology station.

3. The method of claim 1, wherein the adjacent chamber is configured to be placed in a closed position relative to the factory interface under first conditions and is configured to be placed in an open position relative to the factory interface under second conditions.

4. The method of claim 3, wherein the first conditions are associated with transportation or processing of a substrate within the adjacent chamber, and wherein the second conditions are associated with transferring the substrate from the adjacent chamber to the factory interface.

5. The method of claim 1, wherein the oxidation inhibiting gas is up to 5 percent of the gas flowing into the chamber.

6. The method of claim 1, wherein the oxidation inhibiting gas is one or more of hydrogen or ammonia.

7. The method of claim 1, wherein the gas flowing into the chamber further comprises an inert gas, and wherein the inert gas comprises one or more of nitrogen, argon, neon, helium, krypton, or xenon.

8. The method of claim 1, wherein:
the first rate of the non-recirculated oxidation inhibiting gas entering the chamber is changed independent of a second rate of non-recirculated inert gas entering the chamber.

9. The method of claim 1 further comprising:
causing a second amount of inert gas entering into the chamber to be adjusted at a same rate as the adjustment of the current amount of the oxidation inhibiting gas entering into the chamber.

10. The method of claim 1 further comprising:
responsive to determining the adjacent chamber has changed from a closed position to an open position relative to the factory interface, causing a second adjustment of a current amount of the oxidation inhibiting gas entering into the adjacent chamber.

11. A non-transitory machine-readable storage medium storing instructions which, when executed, cause a processing device to perform operations comprising:
flowing gas comprising an oxidation inhibiting gas into a chamber of a semiconductor processing system, wherein the chamber comprises one or more of a factory interface of the semiconductor processing system or an adjacent chamber that is mounted to the factory interface, wherein the flowing of the gas comprises recirculating existing gas from the chamber back into the chamber;
receiving, via one or more sensors coupled to the chamber, sensor data indicating at least one of a current oxygen level within the chamber or a current moisture level within the chamber;
determining, based on the sensor data, whether to perform an adjustment of a current amount of the oxidation inhibiting gas entering into the chamber; and
responsive to determining to perform the adjustment, causing the adjustment of the current amount of the oxidation inhibiting gas entering into the chamber, wherein the causing of the adjustment of the current amount of the oxidation inhibiting gas entering into the chamber comprises changing a first rate of non-recirculated oxidation inhibiting gas entering the chamber.

12. The non-transitory machine-readable storage medium of claim 11, wherein the adjacent chamber comprises one or more of:
a substrate enclosure system;
a loadlock system;
a side storage pod (SSP);
a cooling station; or
a metrology station.

13. A non-transitory machine-readable storage medium of claim 11, wherein the oxidation inhibiting gas is up to 5 percent of the gas flowing into the chamber, and wherein the oxidation inhibiting gas is one or more of hydrogen or ammonia.

14. The non-transitory machine-readable storage medium of claim 11, wherein the gas flowing into the chamber further comprises an inert gas, and wherein the inert gas comprises one or more of nitrogen, argon, neon, helium, krypton, or xenon.

15. The non-transitory machine-readable storage medium of claim 11, wherein the first rate of the non-recirculated oxidation inhibiting gas entering the chamber is changed independent of a second rate of non-recirculated inert gas entering the chamber.

16. A semiconductor processing system comprising:
a chamber comprising an oxidation inhibiting gas inlet configured to receive a flow of gas comprising an oxidation inhibiting gas into the chamber, wherein the chamber comprises one or more of a factory interface or an adjacent chamber that is mounted to the factory interface, and wherein the flow of the gas comprises recirculated existing gas from the chamber;
one or more sensors coupled to the chamber, wherein the one or more sensors are configured to provide sensor data indicating at least one of a current oxygen level within the chamber or a current moisture level within the chamber; and
a processing device to cause, based on the sensor data, an adjustment of a current amount of the oxidation inhibiting gas entering into the chamber, wherein the adjustment of the current amount of the oxidation inhibiting gas entering into the chamber comprises changing a first rate of non-recirculated oxidation inhibiting gas entering the chamber.

17. The semiconductor processing system of claim 16, wherein the adjacent chamber comprises one or more of:
a substrate enclosure system;
a loadlock system;
a side storage pod (SSP);
a cooling station; or
a metrology station.

18. The semiconductor processing system of claim 16, wherein the oxidation inhibiting gas is up to 5 percent of gas flowing into the chamber, and wherein the oxidation inhibiting gas is one or more of hydrogen or ammonia.

19. The semiconductor processing system of claim 16, wherein gas flowing into the chamber further comprises an inert gas, and wherein the inert gas comprises one or more of nitrogen, argon, neon, helium, krypton, or xenon.

* * * * *